(12) United States Patent
Verma et al.

(10) Patent No.: US 10,379,446 B2
(45) Date of Patent: Aug. 13, 2019

(54) LITHOGRAPHY SYSTEM, METHOD AND COMPUTER PROGRAM PRODUCT FOR HIERARCHICAL REPRESENTATION OF TWO-DIMENSIONAL OR THREE-DIMENSIONAL SHAPES

(71) Applicant: ASML Netherlands B.V., Veldhoven (NL)

(72) Inventors: Alok Verma, Eindhoven (NL); Sinatra Canggih Kho, Eindhoven (NL); Adriaan Johan Van Leest, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/270,150

(22) Filed: Sep. 20, 2016

(65) Prior Publication Data

US 2017/0090301 A1 Mar. 30, 2017

(30) Foreign Application Priority Data

Sep. 28, 2015 (EP) .................................... 15187192

(51) Int. Cl.
*G03F 7/20* (2006.01)
*G06F 9/00* (2006.01)
*G03F 9/00* (2006.01)

(52) U.S. Cl.
CPC .......... *G03F 7/70625* (2013.01); *G03F 7/705* (2013.01); *G03F 7/70633* (2013.01); *G03F 9/7092* (2013.01)

(58) Field of Classification Search
CPC .. G03F 7/70625; G03F 7/705; G03F 7/70633; G03F 9/7092
See application file for complete search history.

(56) References Cited

U.S. PATENT DOCUMENTS

| | | |
|---|---|---|
| 6,430,733 B1 | 8/2002 | Cohn et al. |
| 6,493,865 B2 | 12/2002 | Fischer et al. |
| 6,738,958 B2 | 5/2004 | Manoo |

(Continued)

FOREIGN PATENT DOCUMENTS

| | | |
|---|---|---|
| EP | 0 831 657 A2 | 3/1998 |
| EP | 1139296 A2 | 10/2001 |

(Continued)

OTHER PUBLICATIONS

International Search Report and Written Opinion of the International Searching Authority directed to related International Patent Application No. PCT/EP2016/071542, dated Dec. 16, 2016; 11 pages.

(Continued)

*Primary Examiner* — Deoram Persaud
(74) *Attorney, Agent, or Firm* — Sterne, Kessler, Goldstein & Fox P.L.L.C.

(57) ABSTRACT

This disclosure includes a variety of methods of describing a shape in a hierarchical manner, and uses of such a hierarchical description. In particular, this disclosure includes a method comprising: fitting one or more sub-shapes of a first order against a shape; determining an error of the fitting; and fitting one or more sub-shapes of a second order against the error.

27 Claims, 21 Drawing Sheets

(56) References Cited

U.S. PATENT DOCUMENTS

| | | | |
|---|---|---|---|
| 6,871,332 B2* | 3/2005 | Li | G06F 17/5068 |
| | | | 716/112 |
| 7,046,375 B2* | 5/2006 | Bischoff | G01B 11/303 |
| | | | 250/559.22 |
| 7,050,051 B1 | 5/2006 | McCormack et al. | |
| 7,145,664 B2 | 12/2006 | Opsal et al. | |
| 7,356,788 B2* | 4/2008 | Chang | G06F 17/5068 |
| | | | 716/52 |
| 7,532,331 B2* | 5/2009 | Kiers | G03F 7/70625 |
| | | | 250/559.22 |
| 7,667,858 B2* | 2/2010 | Chard | H01L 22/12 |
| | | | 356/124 |
| 7,715,019 B2 | 5/2010 | Kiers et al. | |
| 7,823,103 B2 | 10/2010 | Pokorny | |
| 7,916,927 B2* | 3/2011 | Cramer | G03F 7/70625 |
| | | | 382/141 |
| 2004/0210402 A1* | 10/2004 | Opsal | G01N 21/4788 |
| | | | 702/28 |
| 2005/0209816 A1 | 9/2005 | Vuong et al. | |
| 2006/0066855 A1 | 3/2006 | Boef et al. | |
| 2006/0277520 A1* | 12/2006 | Gennari | G03F 7/706 |
| | | | 716/53 |
| 2007/0079277 A1* | 4/2007 | Golubtsov | G03F 1/36 |
| | | | 716/52 |
| 2007/0105029 A1 | 5/2007 | Ausschnitt | |
| 2008/0013107 A1 | 1/2008 | Chard et al. | |
| 2008/0088832 A1 | 4/2008 | Cramer et al. | |
| 2008/0282211 A1 | 11/2008 | Culp et al. | |
| 2009/0148780 A1 | 6/2009 | Yasuzato | |
| 2011/0027704 A1 | 2/2011 | Cramer et al. | |
| 2011/0043791 A1 | 2/2011 | Smilde et al. | |
| 2012/0044470 A1 | 2/2012 | Smilde et al. | |
| 2012/0210279 A1* | 8/2012 | Hsu | G03F 1/70 |
| | | | 716/53 |
| 2014/0272675 A1 | 9/2014 | Jacques et al. | |
| 2015/0286130 A1 | 10/2015 | Utzney et al. | |

FOREIGN PATENT DOCUMENTS

| | | |
|---|---|---|
| WO | WO 2011/151121 A1 | 12/2011 |
| WO | WO 2015/022239 A1 | 2/2015 |

OTHER PUBLICATIONS

Xu, Jianning, "Hierarchical representation of 2-D shapes using convex polygons: A morphological approach," Pattern Recognition Letters, vol. 18, Issue 10, Oct. 1997; pp. 1009-1017.

Xu, Jianning, "Efficient Morphological Shape Representation with Overlapping Disk Components," IEEE Transactions on Image Processing, vol. 10, Issue 9, Sep. 2001; pp. 1346-1356.

Office Action in ROC (Taiwan) Patent Application No. 105131264, dated Oct. 25, 2017, 7 pages.

* cited by examiner

LITHOGRAPHY SYSTEM, METHOD AND COMPUTER PROGRAM PRODUCT FOR HIERARCHICAL REPRESENTATION OF TWO-DIMENSIONAL OR THREE-DIMENSIONAL SHAPES

BACKGROUND

A lithographic projection apparatus can be used, for example, in the manufacture of integrated circuits (ICs). In such a case, a patterning device (e.g., a mask) may contain or provide a circuit pattern corresponding to at least a part of an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

In order to monitor one or more steps of the patterning process (i.e., a process of device manufacturing involving making patterned structures, that includes, e.g., optical lithography, imprint, resist-processing, etching, development, baking, etc.), the patterned substrate is inspected and one or more parameters of the patterned substrate are measured. The one or more parameters may include, for example, the overlay error between successive layers formed in or on the patterned substrate and/or critical dimension (e.g., linewidth) of developed photosensitive resist. This measurement may be performed on a target of the product substrate itself and/or on a dedicated metrology target provided on the substrate. There are various techniques for making measurements of the microscopic structures formed in patterning processes, including the use of a scanning electron microscope and/or various specialized tools.

A fast and non-invasive form of specialized inspection tool is a scatterometer in which a beam of radiation is directed onto a target on a substrate and properties of the scattered and/or reflected (or more generally redirected) beam are measured. By comparing one or more properties of the beam before and after it has been redirected from the substrate, one or more properties of the substrate (e.g., of one or more of its layers and one or more structure formed in the one or more layers) can be determined. Two main types of scatterometer are known. A spectroscopic scatterometer directs a broadband radiation beam onto the substrate and measures the spectrum (intensity as a function of wavelength) of the radiation redirected into a particular narrow angular range. An angularly resolved scatterometer uses a monochromatic radiation beam and measures the intensity of the redirected radiation as a function of angle.

A particular application of scatterometry is in the measurement of feature asymmetry within a periodic target. This can be used as a measure of overlay error, for example, but other applications are also known. Another application of scatterometry is deriving parameters of interest of a target or device structure, such as critical dimension, sidewall angle, etc. In an angle resolved scatterometer, asymmetry can be measured by comparing opposite parts of the diffraction spectrum (for example, comparing the −1st and +1st orders in the diffraction spectrum of a periodic grating). This can be done simply in angle-resolved scatterometry, as is described for example in U.S. patent application publication US2006-066855, which is incorporated herein its entirety by reference.

SUMMARY

Described herein is a method comprising: fitting, using a computer system, a sub-shape of a first order against a shape; determining, by the computer system, an error of the fitting; and fitting, using the computer system, a sub-shape of a second order against the error.

According to an embodiment, the sub-shape of the first order is obtained from a database, a design layout, empirically, or from a model.

According to an embodiment, the fitting the sub-shape of the first order comprises determining a characteristic of the sub-shape of the first order that causes the sub-shape of the first order to cover as much of an area or a volume of the shape as possible while remaining entirely inside the shape.

According to an embodiment, the fitting the sub-shape of the first order comprises minimizing an error function between the sub-shape of the first order and the shape.

According to an embodiment, the method further comprises fitting a plurality of sub-shapes of the first order against the shape, wherein the plurality of sub-shapes of the first order at least partially overlap with one another.

According to an embodiment, the shape is three dimensional.

According to an embodiment, the method further comprises fitting a plurality of sub-shapes of the second order against the shape, wherein the plurality of sub-shapes of the second order at least partially overlap with at least one sub-shape of the first order.

According to an embodiment, the sub-shape of the first order is capable of being determined from fewer parameters than the sub-shape of the second order.

Disclosed herein is a method of optimizing a hierarchical description of a shape, the method comprising: fitting, using a computer system, a sub-shape of a first order against the shape; fitting, using the computer system, a sub-shape of a second order against the shape; and co-optimizing, by the computer system, the sub-shape of the first order and sub-shape of the second order.

According to an embodiment, the sub-shape of the first order is obtained from a database, a design layout, empirically, or from a model.

According to an embodiment, fitting the sub-shape of the first order comprises determining a characteristic of the sub-shape of the first order that causes the sub-shape of the first order to cover as much of an area or a volume of the shape as possible while remaining entirely inside the shape.

According to an embodiment, fitting the sub-shape of the first order comprises minimizing an error function between the sub-shape of the first order and the shape.

According to an embodiment, the method further comprises of sub-shapes of the first order at least partially overlap with one another.

According to an embodiment, the shape is three dimensional.

According to an embodiment, the method further comprises fitting a plurality of sub-shapes of the second order against the shape, wherein the plurality of sub-shapes of the second order at least partially overlap with at least one sub-shape of the first order.

According to an embodiment, the sub-shape of the first order is capable of being determined from fewer parameters than the sub-shape of the second order.

Disclosed herein is a method of modeling experimental data obtained from a shape, the method comprising: fitting a sub-shape of a first order against the experimental data; determining data that the fitted sub-shape of the first order alone would produce; determining residue data, the residue data comprising a difference between the experimental data and the data the fitted sub-shape of the first order alone would produce; fitting a sub-shape of a second order against the residue data; determining data that the fitted sub-shape of the second order alone would produce; combining the data that the fitted sub-shape of the first order alone would produce and the data that the fitted sub-shape of the second order alone would produce; and adjusting the fitted sub-shape of the first order and the fitted sub-shape of the second order based on the combined data and the experimental data.

According to an embodiment, determining the data that the fitted sub-shape of the first order alone would produce comprises simulation.

According to an embodiment, determining the data that the fitted sub-shape of the second order alone would produce comprises simulation.

Disclosed herein is a method of modeling experimental data obtained from a shape, the method comprising: co-fitting a sub-shape of a first order and a sub-shape of a second order against the experimental data; determining data that the fitted sub-shape of the first order and the fitted sub-shape of the second order jointly would produce; and adjusting the fitted sub-shape of the first order and the fitted sub-shape of the second order based on the data that these sub-shapes jointly would produce and the experimental data.

According to an embodiment, determining the data that the fitted sub-shape of the first order and the fitted sub-shape of the second order jointly would produce comprises simulation.

Disclosed herein is a method of obtaining a hierarchical description of a shape, the method comprising: co-fitting a first plurality of sub-shapes against the shape; and if the fitted first plurality of sub-shapes do not describe the shape sufficiently well under one or more criteria, co-fitting a second plurality of sub-shapes against the shape, wherein the first plurality of sub-shapes and the second plurality of sub-shapes are of a same order and wherein the first plurality of sub-shapes is a subset of the second plurality of sub-shapes.

According to an embodiment, the shape is three dimensional.

Disclosed herein is a method of manufacturing devices wherein a device pattern is applied to a series of substrates using a patterning process, the method including inspecting at least a target formed as part of or beside the device pattern on at least one of the substrates, and determining a parameter of interest using any of the methods herein, and controlling the patterning process for later substrates in accordance with the parameter of interest.

Disclosed herein is a computer program product comprising a computer readable medium having instructions recorded thereon, the instructions when executed by a computer implementing any of the methods herein.

Disclosed herein is a computer program product comprising a computer readable medium having a database recorded thereon, wherein the database comprises models of sub-shapes of a plurality of different orders, wherein each of the models have an adjustable parameter.

Disclosed herein is a computer program product comprising a computer readable medium having a data structure recorded thereon, wherein the data structure comprises a description of a sub-shape of a first order fitted against a shape, and the data structure comprises a description of a sub-shape of a second order fitted against the shape.

According to an embodiment, the description of the sub-shape of the first order comprises a parameter of the sub-shape of the first order.

Disclosed herein is a system comprising: an inspection apparatus configured to provide a beam on a measurement target on a substrate and to detect radiation redirected by the target to determine a parameter of a patterning process; and any of the non-transitory computer program products herein.

According to an embodiment, the system further comprises a lithographic apparatus, the lithographic apparatus comprising a support structure configured to hold a patterning device to modulate a radiation beam and a projection optical system arranged to project the modulated onto a radiation-sensitive substrate.

DETAILED DESCRIPTION

Figure 1:
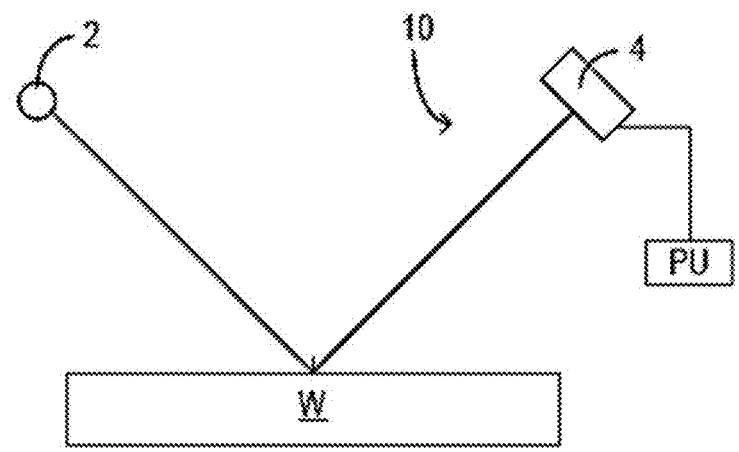
FIG. 1 schematically depicts an example inspection apparatus and metrology technique.
Figure 1:
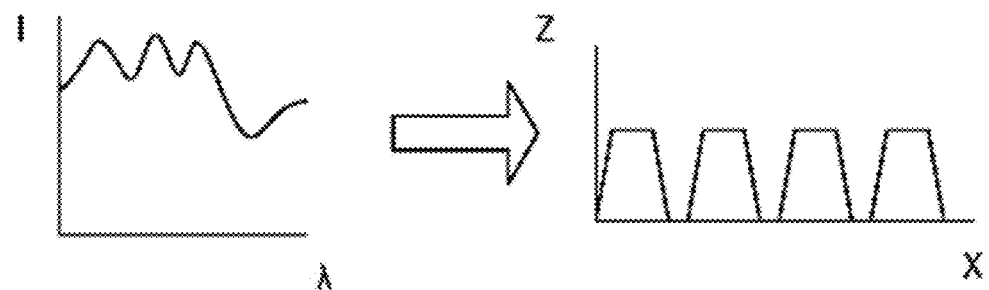

FIG. 1 depicts an example inspection apparatus (e.g., a scatterometer). It comprises a broadband (white light) radiation projector 2 which projects radiation onto a target located, for example, on substrate W. The reflected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 1. In general, for the reconstruction the general form of the structure is known and some parameters are assumed from knowledge of the process by which the structure was made, leaving only a few parameters of the structure to be determined from the measured data. Such an inspection apparatus may be configured as a normal-incidence inspection apparatus or an oblique-incidence inspection apparatus.

Figure 2A:
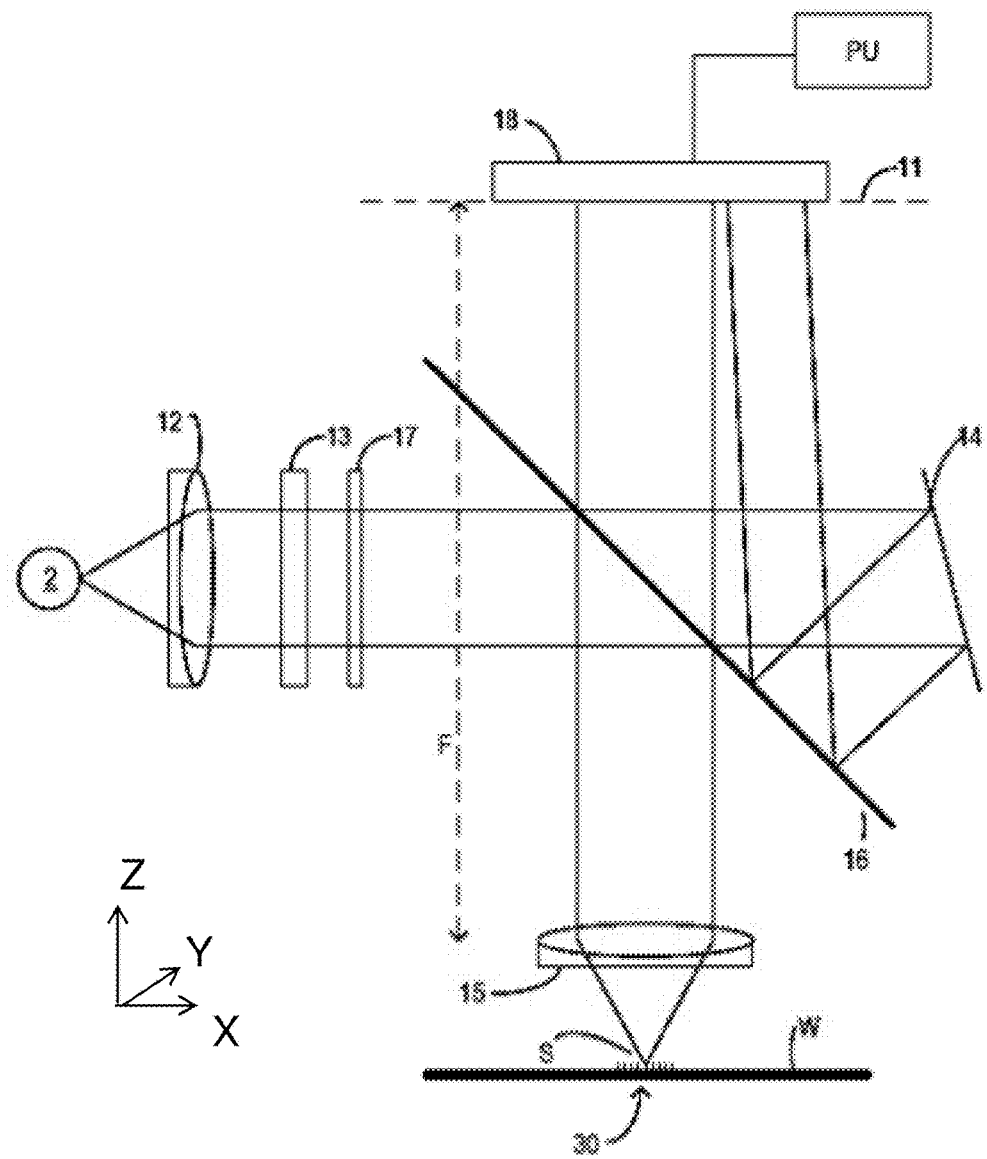
FIG. 2A schematically depicts an example inspection apparatus.

Another inspection apparatus that may be used is shown in FIG. 2A. In this device, the radiation emitted by radiation source 2 is collimated using lens system 12 and transmitted through interference filter 13 and polarizer 17, reflected by partially reflecting surface 16 and is focused into a spot S on a target 30 on, e.g., substrate W via an objective lens 15, which has a high numerical aperture (NA), desirably at least 0.9 or at least 0.95. An immersion inspection apparatus (using a relatively high refractive index fluid such as water) may even have a numerical aperture over 1.

In a lithographic apparatus, one or more substrate tables may be provided to hold the substrate during measurement operations. In an example where the inspection apparatus is integrated with the lithographic apparatus, they may even be the same substrate table. Coarse and fine positioners may be provided to a second positioner configured to accurately position the substrate in relation to a measurement optical system. Various sensors and actuators are provided for example to acquire the position of a target of interest, and to bring it into position under the objective lens 15. Typically many measurements will be made on targets at different locations across the substrate. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the target then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of the target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to optical aberration in the lithographic projection apparatus, particularly the projection system PS, and illumination symmetry and the presence of such aberration will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 1 or FIG. 2A are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 2A, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 2B:
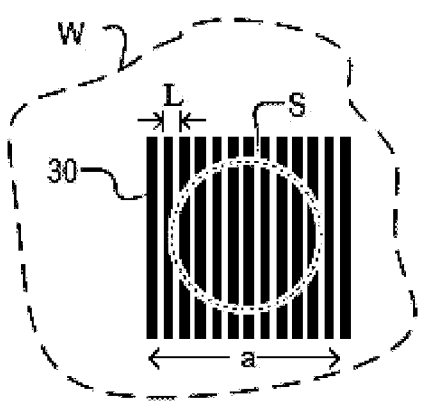
FIG. 2B illustrates the relationship between an illumination spot of an inspection apparatus and a metrology target.
Figure 4:
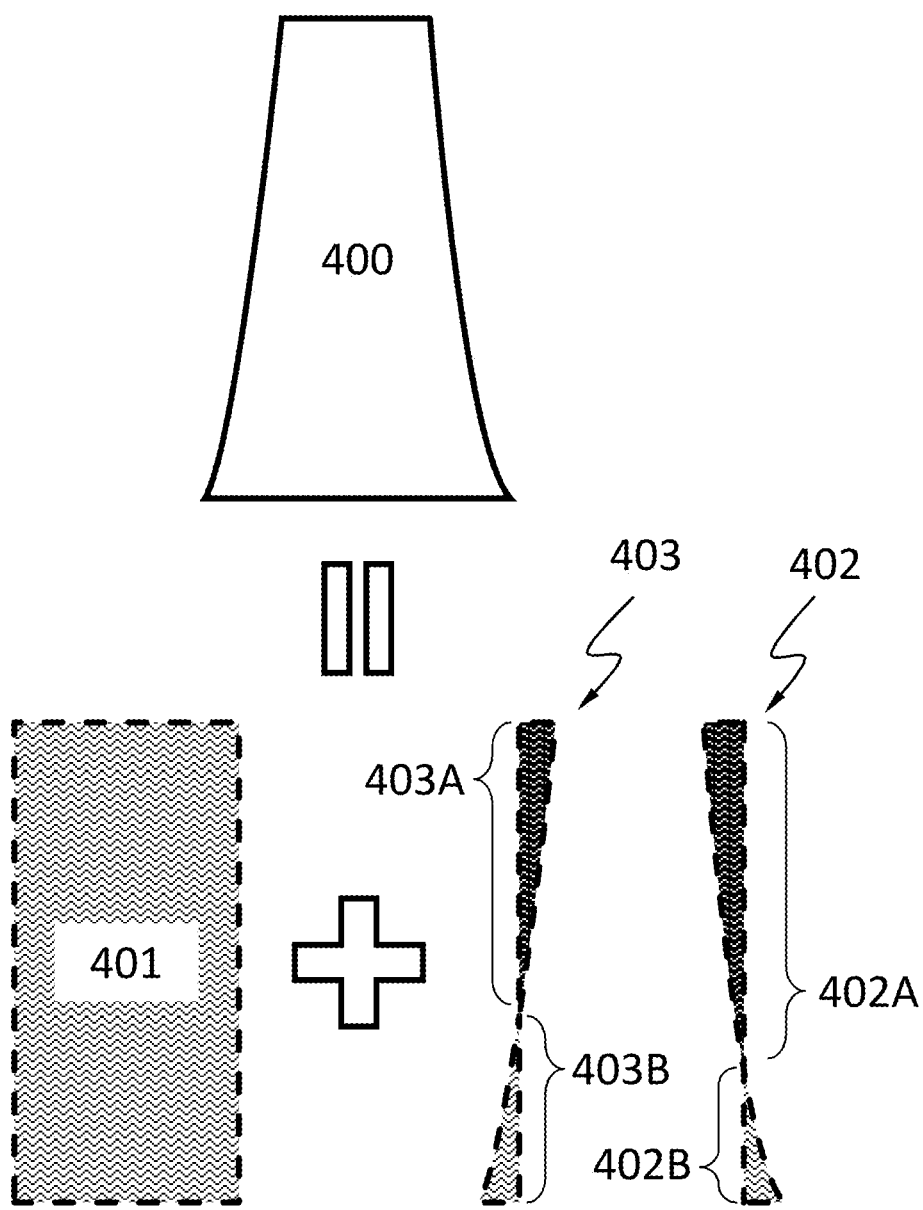

FIG. 2B illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

But, there is demand to reduce the space occupied by metrology targets. For example, there is a desire to reduce the width of 'scribe lanes' between target portions C on the substrate, where metrology targets have conventionally been located. Additionally or alternatively, there is a desire, for example, to include metrology targets within the device patterns themselves, to allow more accurate and/or precise monitoring and correction of variations in parameters such as CD and/or overlay. To this end, alternative methods of diffraction based metrology have been devised more recently. For example, in image-based metrology, two images of the target are made, each using different selected orders of the diffraction spectrum. Comparing the two images, one can obtain asymmetry information. By selecting parts of the images, one can separate the target signal from its surroundings. The targets can be made smaller, and need not be square, so that several can be included within the same illumination spot. Examples of this technique are described in U.S. patent application publications US2011-0027704, US2011-0043791, and US2012-0044470, which are each incorporated in its entirety by reference.

In addition to or alternatively to reducing the space occupied by metrology targets, there is demand to improve the nature of the measurements themselves, such as their accuracy and/or precision. For example, there is a desire to, for example, obtain higher sensitivity of measurement. Additionally or alternatively, there is a desire to, for example, obtain better decoupling between various parameters in, e.g., the reconstruction described above. For example, it is desired to obtain better values for each of the specific parameters of interest, by reducing or eliminating the effect of measurements associated with one parameter of interest influencing another parameter of interest.

As the demand for size reduction and/or accuracy/precision continues, existing techniques may meet some technical limitations. For example, some methods desire to capture at least the ±1st diffraction orders. Taking into account the numerical aperture of the objective 15, this constrains the pitch (L) of a periodic structure of the target. To improve sensitivity and/or to reduce target size, one can consider using shorter wavelengths λ. Further, the target cannot be too small otherwise it will not have enough features to be considered as a periodic structure. Consequently, overlay, as an example, is measured using periodic structures features (e.g., lines) having dimensions far bigger than those of the product (e.g., device) layout, making overlay measurement less reliable. Ideally the feature line and pitch should have similar dimensions to the product features.

In an embodiment, the inspection apparatus may operate with visible light despite the fact that the periodic structure of the target is beyond the imaging resolution limit in visible light. Therefore, a target periodic structure may not be imaged directly.

In an embodiment, a reconstruction of one or more geometrical (e.g., bottom CD, top CD, side wall angle, height, etc.) and/or optical parameters of the target is computed based on the measured radiation distribution (e.g., angular resolved intensity radiation distribution) that is detected in the back focal plane (or a conjugate thereof) of the objective lens. As noted above, this radiation distribution may be referred to as a pupil.

Figure 2C:
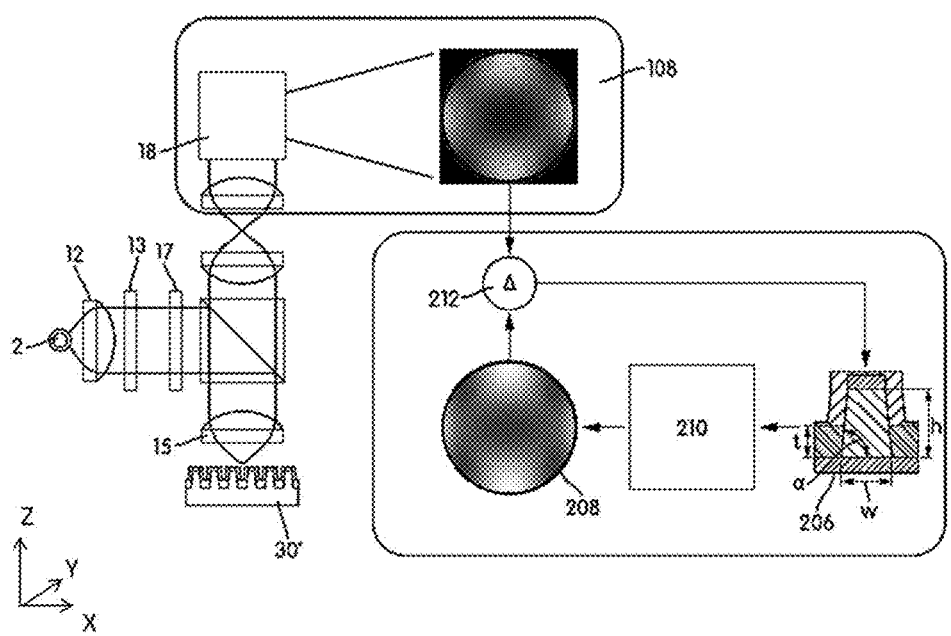
FIG. 2C schematically depicts a process of deriving a parameter of interest based on measurement data.
Figure 2D:
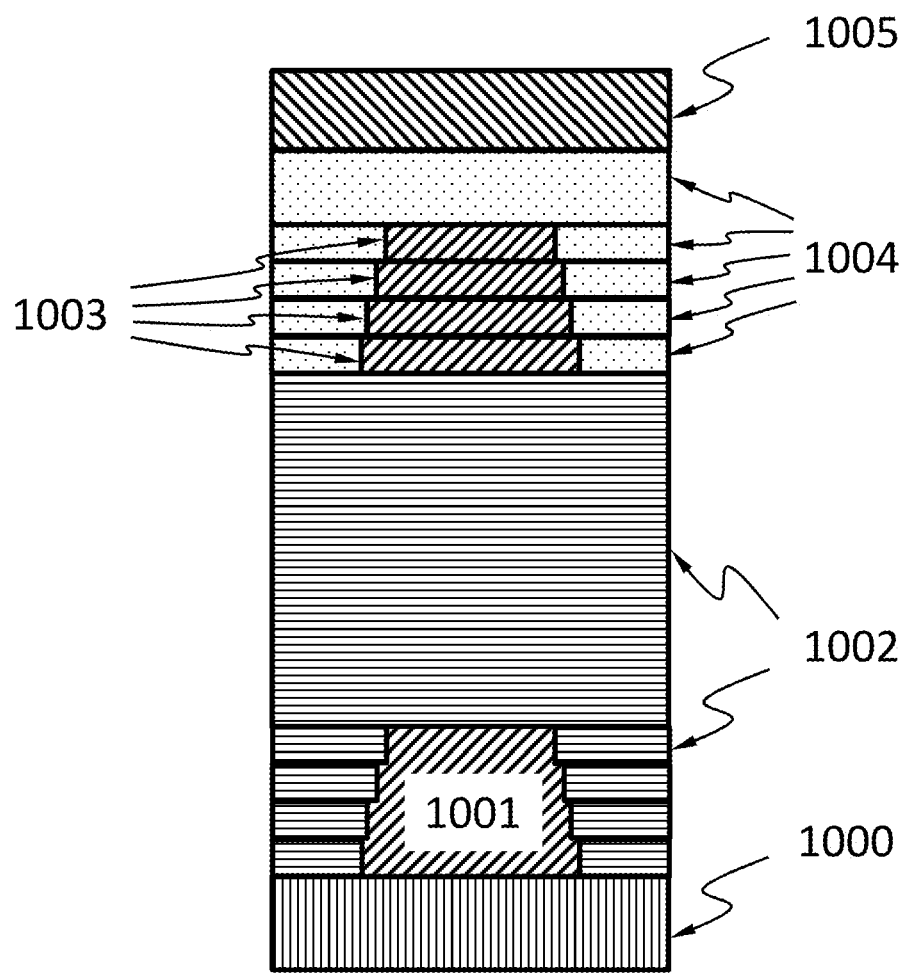
FIG. 2D schematically depicts an example unit cell model of a feature of a periodic structure of a target.

FIG. 2C schematically depicts an example process of the determination of one or more parameters of interest of a target pattern based on measurement data obtained using metrology. Radiation detected by detector 18 provides a measured radiation distribution 108 for target 30'. This measured radiation distribution 108 contains information to enable derivation of a parameter of interest such as the overlay error between successive layers formed in or on the substrate and/or critical dimension of, e.g., developed photosensitive resist and/or etched structures. FIG. 2D depicts an example unit cell model of a portion of a target (such as target 30, 30') and example layers of various materials making up, and associated with, the target. For example, the target may comprise a layer of silicon nitride ($Si_3N_4$) represented by segment 1001, which layer may form a grating feature, overlying, e.g., a bare silicon substrate or other layer represented by segment 1000. Overlying layer 1001 may be a layer of TEOS (tetraethyl orthosilicate) represented by segment 1002. Overlying layer 1002 is a further layer of silicon nitride ($Si_3N_4$) represented by one or more segments 1003, which may form a further grating feature (e.g., a grating feature for measuring overlay). Overlying layer 1003 is a vacuum or non-solid medium gap represented by one or segments 1004, such as gas (e.g., air). And, further overlying layer 1003 is an optical element, represented by segment 1005, from which radiation emanates, through the vacuum/medium 1004, toward the layer 1003. In FIG. 2D, the layer 1003 and vacuum/medium 1004 are shown segmented in to a plurality of segments to facilitate calculation, while in reality the layer 1003 and/or vacuum/medium 1004 is typically continuous. Similarly, layers 1005, 1002, 1001 and 1000 are represented by a single segment, but may be represented by a plurality of segments. Thus, one or more structures of the target may be modeled by various shapes, each of the shapes defined by one or more parameters and the values of those parameters determined using the measured radiation.

For a given target 30', a radiation distribution 208 can be computed/simulated from a parameterized model 206 (such as the unit cell of FIG. 2D) of the pattern for target 30' using, for example, a numerical Maxwell solver 210. The parameterized model 206 may include one or more of the parameters of the segments identified in FIG. 2D, such as the thickness of one or more layers, the refractive index (e.g., a real or complex refractive index, refractive index tensor, etc.) of one or more of the layers, a sidewall angle of one or more layers, absorption of one or more layers, etc., as well as of any portions thereof (such as one or more portions or combinations of portions) such as the segments identified for the layer 1003 and vacuum/medium 1004. The initial values of the parameters may be those expected for the target being measured. The measured radiation distribution 108 is then compared at 212 to the computed radiation distribution 208 to determine the difference between the two. If there is a difference, the values of one or more of the parameters of the parameterized model 206 may be varied, a new computed radiation distribution 208 calculated and compared against the measured radiation distribution 108 until there is sufficient match between the measured radiation distribution 108 and the computed radiation distribution 208. At that point, the values of the parameters of the parameterized model 206 provide a good or best match of the geometry of the actual target 30'. In an embodiment, the reconstruction of the target periodic structure parameters is achieved by minimizing a difference between the detected radiation distribution and a computed radiation distribution for a parameterized model of the target grating. The optimizer used in this reconstruction may also take into account prior knowledge on the statistical distribution of the periodic structure parameters in the patterning process.

One or more of those determined parameters of the parameterized model (e.g., CD) may be used, e.g., by the user for evaluating one or more steps of the patterning process or other manufacturing process, control of one or more steps of the patterning process or other manufacturing process, reconfiguration of one or more devices used in the patterning process or other manufacturing process, etc. Additionally or alternatively, a parameter of interest may be derived from one or more of the values of the parameterized model.

As discussed above, the geometrical and optical properties of the target are captured in a parameterized model (e.g., a model such as in FIG. 2D), of which one or more parameters of interest (e.g., a CD parameter) form a subset. Using, e.g., a Maxwell solver, the values of the model parameters for the measured target are reconstructed in a computational post-processing of the recorded pupil that is called reconstruction. In an embodiment, the model may include the gap as a floating parameter to be reconstructed.

In an embodiment, to enable relatively fast calculation using, e.g., a forward model Maxwell solver, typically only one or a few features of the periodic structure of a target are modelled. Periodic boundary conditions are then used to approximate the full periodic structure. An example of a model of a single feature of a periodic structure, for use in such calculations, is shown in FIG. 2D, which depicts an inspection apparatus optical element tip 1005, the target feature and associated layers 1000, 1001, 1002, 1003, and the gap 1004 between the tip 1005 and the target feature. As will be appreciated, the tip, gap, target feature and/or layers may have different refractive index (e.g., a real or complex refractive index, refractive index tensor, etc.) as roughly represented in the FIG. 2D example by the different pattern fill.

Alternatively or additional to measurement of a parameter by reconstruction, a measured radiation distribution is useful in the measurement of asymmetry of features in product and/or resist patterns. A particular application of asymmetry measurement is for the measurement of overlay, where the target 30 comprises one set of periodic features superimposed on another. While the positions of the diffraction orders in the diffraction spectrum of the target are determined only by the periodicity of the target, asymmetry in the diffraction spectrum is indicative of asymmetry in the individual features which make up the target. Such asymmetry in the diffraction orders appears directly as asymmetry in the pupil image recorded by detector 18. This asymmetry can be measured by digital image processing in unit PU, and calibrated against known values of overlay.

Figure 2E:
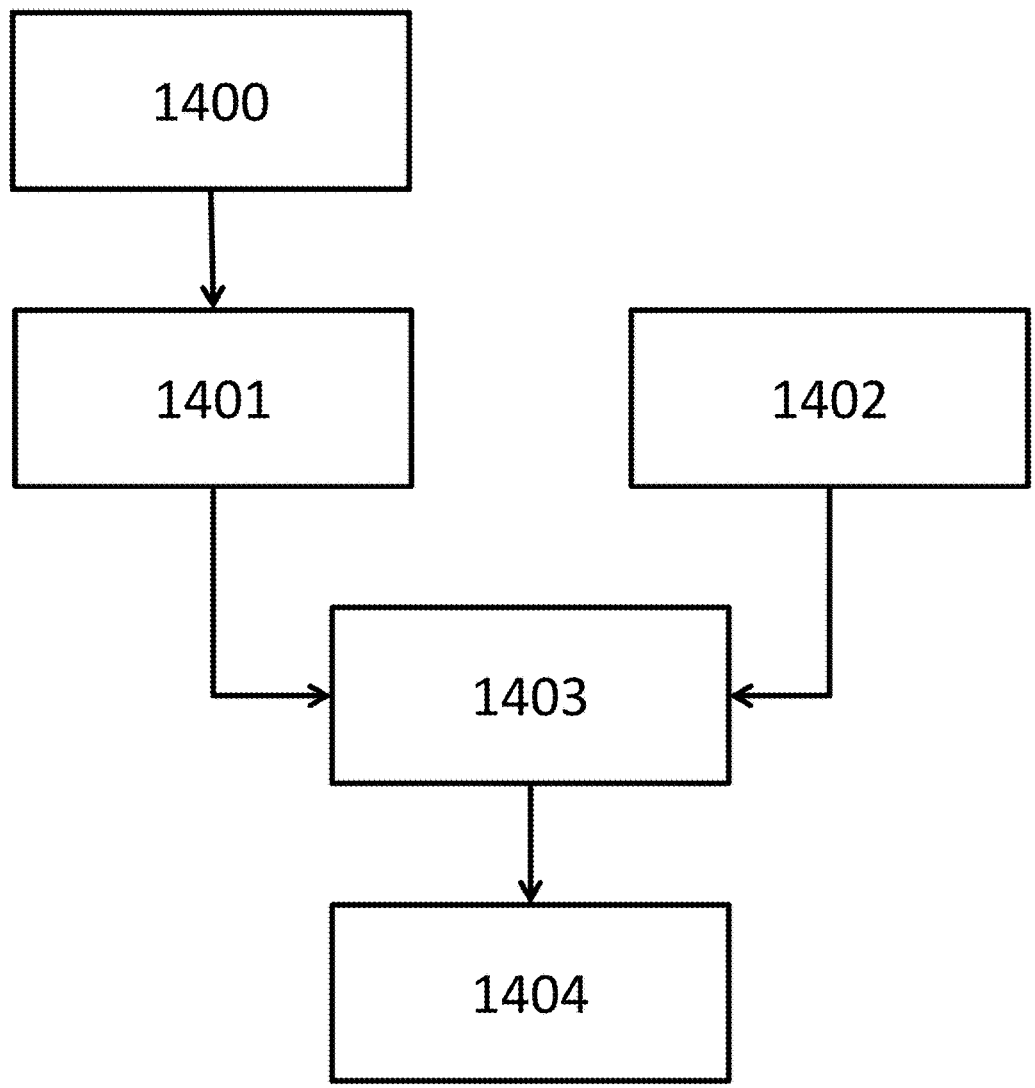
FIG. 2E schematically depicts a flow diagram of a process to derive one or more parameters of interest of a target based on a measured data.

FIG. 2E schematically depicts a flow diagram of a process of reconstruction using a model of one or more parameters of a target. At 1400, a nominal parametric model for the target structure is set up (e.g., with dimensions of one or more layers associated with the target, one or more refractive indices of one or more layers, one or more nominal gap values for the measurements, one or more measured radiation wavelengths and/or polarizations, etc.). In an embodiment, a plurality of calculation unit cells may be used, each unit cell having a set of floating parameters of the target periodic structure. Each unit cell would comprise a set of floating parameters of the target periodic structure. The solver will subsequently find one set of optimal parameters for the target periodic structure (including the one or more parameters of interest). Thus, a parameter of interest can be derived by a reconstruction similar to as described above by minimizing a difference between data of a measured radiation distribution and data of the corresponding calculated radiation distribution.

At 1401, an ideal pupil (radiation distribution) expected from measuring the target with a measurement beam is calculated using the model of 1400.

At 1402, a radiation distribution is measured for the target. Optionally, two or more different wavelengths and/or polarizations may be used in obtaining the radiation distribution.

At 1403, data of the radiation distributions are applied to a reconstruction process to derive one or more parameters of interest 1404 of the target. For example, the process of FIG. 6 may be used at 1403. In an embodiment, a parameter of interest can be derived by a reconstruction similar to as described above by minimizing a difference between data of the measured radiation distribution and data of the corresponding calculated radiation distribution. If two or more different wavelengths and/or polarizations are used, then the reconstruction process would be appropriately modified. The parameter of interest may then be used to, e.g., evaluate the performance of a method in a lithograph As described above, in an embodiment, there are provided various techniques to process a parameter of interest from measurement data. The techniques have particular applicability in an optical metrology or inspection apparatus such as a scatterometer, an alignment sensor (which determines alignment using one or more alignment marks), an encoder or interferometer (which enables position measurement), and/or a height or level sensor (which enables measuring of the position of a surface). But, while the embodiments disclosed herein use optical metrology as an application of the disclosed techniques, the techniques can be applied in other applications. The techniques need not be applied exclusively, and could be applied in combination with one or more other techniques, including one or more techniques discussed in the cited documents.

Interpreting or using experimental data obtained in, for example, the inspection of a target or device feature on a substrate may require fitting a model of one or more structures to the experimental data. One example of a model involves description of one or more two-dimensional shapes and/or three-dimensional shapes. For example, when a physical shape of a structure is measured using a metrology, the physical shape may be described by data in a way more abstract than an image of the design shape of the structure (e.g., the data may be parameterized—as a number of parameters). For example, when using a metrology tool that does not obtain raw data in the form of images, it may be useful to infer the shape measured from the raw data. Such inference may be achieved by fitting the values of a number of parameters of a model that describes the shape measured. Examples of three-dimensional shapes include a feature etched into a substrate and a feature in a layer of resist after development. Examples of two-dimensional shapes include a cross-sectional shape of a three-dimensional shape, and a shape of a surface of a three dimensional shape. The term "two-dimensional" and the term "three-dimensional" refer to the number of the geometrical dimensions of the shape, not the number of parameters required to fully define the shape. A two-dimensional shape may require more than two parameters to fully define it. A three-dimensional shape may require more than three parameters to fully define it.

One way to describe a shape includes description of all the boundaries of the shape. Such a description may not be very convenient to represent the impact of tunable parameters of the patterning process on the shape. Such a description may not be very flexible. A minor change of the shape may require change of the model itself, not merely the values of the parameters of the model. For example, when a shape is changed by adding a boundary, additional parameters may have to be added into the model.

According to an embodiment, a shape is described in a hierarchical manner. Namely, a shape is described by a hierarchy of sub-shapes, where one or more sub-shapes of a higher order capture the more general characteristics of the shape and one or more sub-shapes of a lower order capture the more nuanced characteristics of the shape. The combination (e.g., overlay, union, subtraction, intersection, exclusion) of the sub-shapes of the highest orders approximates the shape. The more orders that are included in the combination, the more nuanced characteristics of the shape are included in the combination.

The sub-shapes of any or all of the orders may be themselves parameterized. Therefore, the shape may be described by a hierarchy of parameters—parameters of the sub-shapes. A sub-shape of a higher order may be parameterized into fewer parameters than a sub-shape of a lower order is parameterized. For example, a circle may be of a higher order than a square because a circle may be parameterized into merely two parameters (e.g., diameter and location) and a square may be parameterized into at least three parameters (e.g., length of sides, location and orientation). For example, a square may be of a higher order than a rectangle because a rectangle may be parameterized into at least four parameters (e.g., length of the longer/shorter side, length of the shorter/longer side and/or aspect ratio, location and orientation); a rectangle may be of a higher order than a triangle or a parallelogram, which in turn may be of a higher order than a trapezoid. A sub-shape may be described by a parameterized curve, such as a Bezier curve, a spline, a polynomial curve, etc. In this disclosure, the nomenclature is that a n-th order is higher than a (n+1)-th order.

Figure 3:
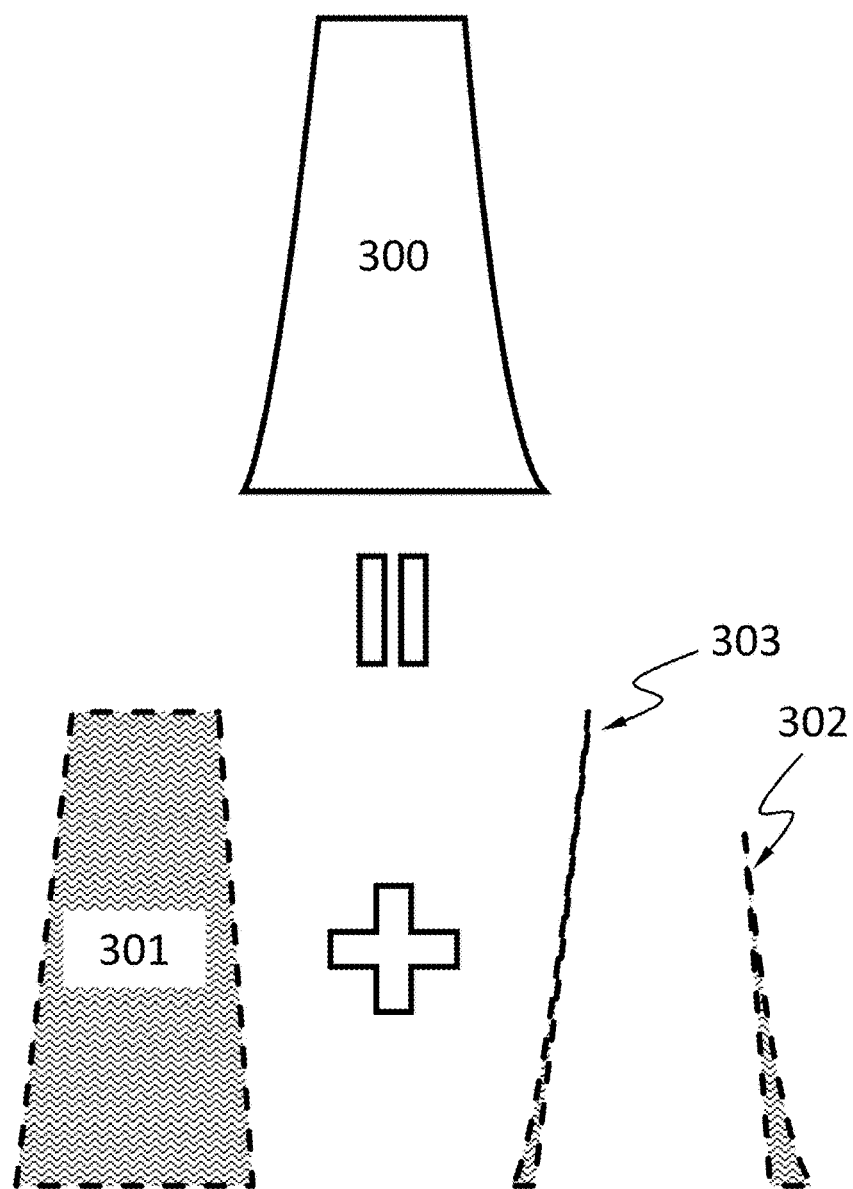
FIGS. 3-7 each schematically show that, according to an embodiment, a shape may be hierarchically described by sub-shapes of different orders, according to an embodiment.

FIG. 3 schematically shows that, according to an embodiment, a shape 300 may be described by a sub-shape 301, which is a trapezoid, and two sub-shapes 302 and 303. In this example, the sub-shape 301 is of a higher order than the sub-shapes 302 and 303 because the sub-shape 301 captures the general geometry of the shape 300 and the sub-shapes 302 and 303 capture the details (e.g., the flared corners). In this embodiment, the sub-shape 301 may fit entirely inside the shape 300. In this embodiment, the shape 300 is the union of the sub-shapes 301, 302 and 303. The sub-shapes 301, 302 and 303 do not have any overlap with one another in this example, but they may have overlap. For example, there may be a single sub-shape 302, 303 that overlaps at least part of the higher order sub-shape 301 and that captures the details of the sub-shapes 302 and 303 in FIG. 3 (for example, a shape defined by the sub-shapes 302 and 303 in FIG. 3 with the respective tops and bottoms of the sub-shapes 302 and 303 in FIG. 3 connected by lines).

FIG. 4 schematically shows that, according to an embodiment, a shape 400 may be described by a sub-shape 401, which is a rectangle, and two sub-shapes 402 and 403. In this example, the sub-shape 401 is of a higher order than the sub-shapes 402 and 403 because the sub-shape 401 captures the general geometry of the shape 400 and the sub-shapes 402 and 403 capture the details (e.g., the flared corners and narrowed top). Notably, the sub-shape 401 does not fit entirely inside the shape 400 and a portion 402A of the sub-shape 402 and a portion 403A of the sub-shape 403 are thus "negative." Namely, when the sub-shapes 402, 403 and the sub-shape 401 are combined, the portions 402A and 403A are not added to, but subtracted from the sub-shape 401. The rest (402B) of the sub-shape 402 and the rest (403B) of the sub-shape 403 are "positive." Namely, when the sub-shapes 402, 403 and the sub-shape 401 are combined, the portions 402B and 403B are added to the sub-shape 401. Each portion 402A, 403A, 402B, and 403B may be considered a sub-shape. In this embodiment, the sub-shape 401 and the sub-shapes/portions 402B and 403B do not have any overlap with one another, but it does not have to be so. For example, there may be a single sub-shape/portion 402B, 403B that overlaps at least part of the higher order sub-shape 401 and that captures the details of the sub-shapes/portions 402B and 403B in FIG. 4 (for example, a shape defined by the sub-shapes/portions 402B and 403B in FIG. 4 with the respective tops and bottoms of the sub-shapes 402B and 403B in FIG. 4 connected by lines).

Figure 5:
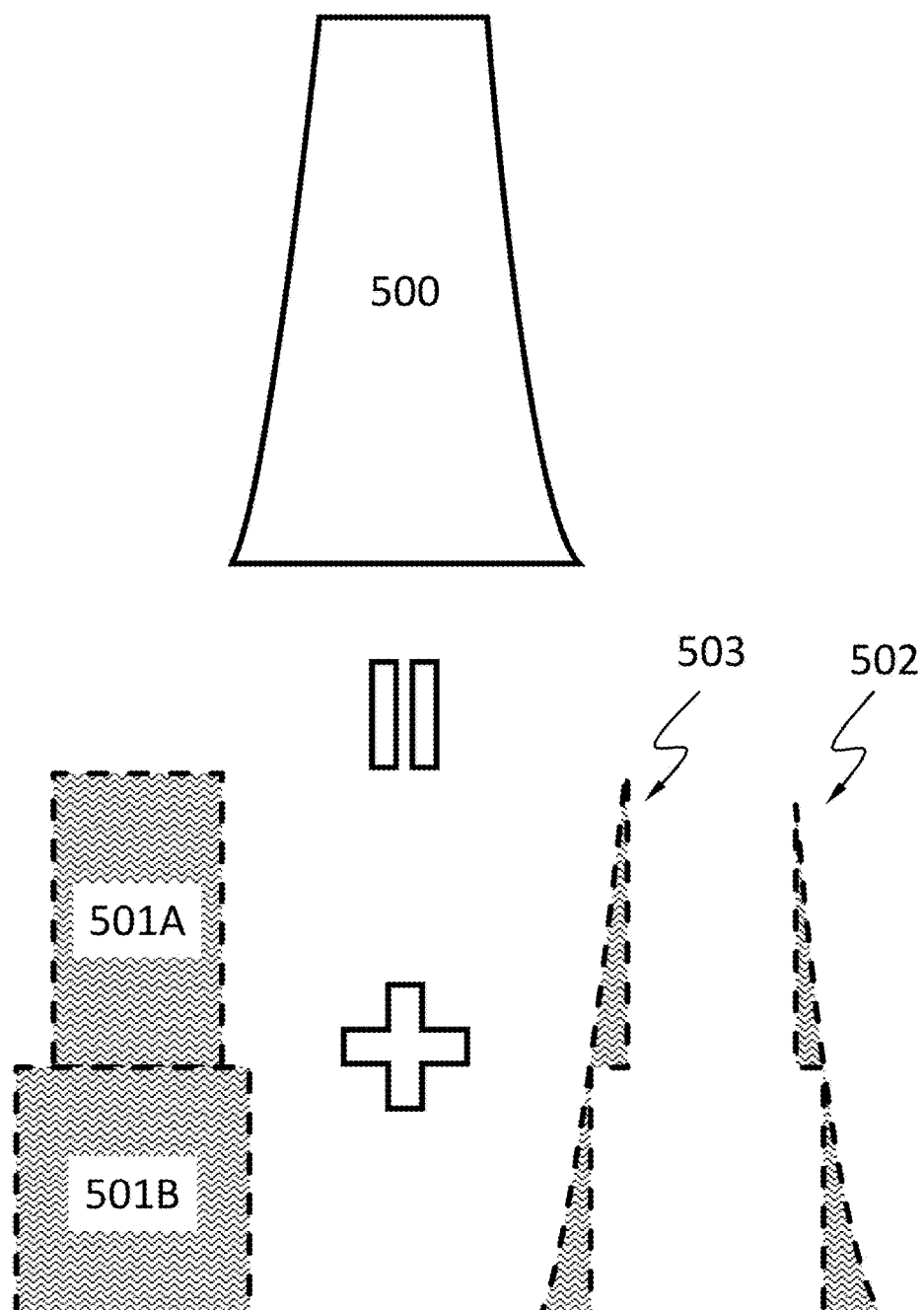

FIG. 5 schematically shows that, according to an embodiment, a shape 500 may be described by sub-shapes 501A and 501B, each of which is a rectangle, and two sub-shapes 502 and 503. The sub-shapes 501A and 501B are not necessarily the same type of sub-shape but are of the same order higher than the sub-shapes 502 and 503; for example, the sub-shapes 501A and 501B can be a rectangle and a rhombus. In this example, the sub-shapes 501A and 501B are of a higher order than the sub-shapes 502 and 503 because the sub-shapes 501A and 501B combined capture the general geometry of the shape 500 and the sub-shapes 502 and 503 capture the details (e.g., the flared corners and the slanted and curved sides). The shape 500 is the union of the sub-shapes 501A, 501B, 502 and 503. The sub-shapes 501A, 501B, 502 and 503 do not have any overlap with one another, but it does not have to be so. For example, there may be a single sub-shape 502, 503 that overlaps at least part of the higher order sub-shapes 501A and 501B and that captures the details of the sub-shapes 502 and 503 in FIG. 5 (for example, a shape defined by the sub-shapes 502 and 503 in FIG. 5 with the respective tops and bottoms of the sub-shapes 502 and 503 in FIG. 5 connected by lines).

Figure 6:
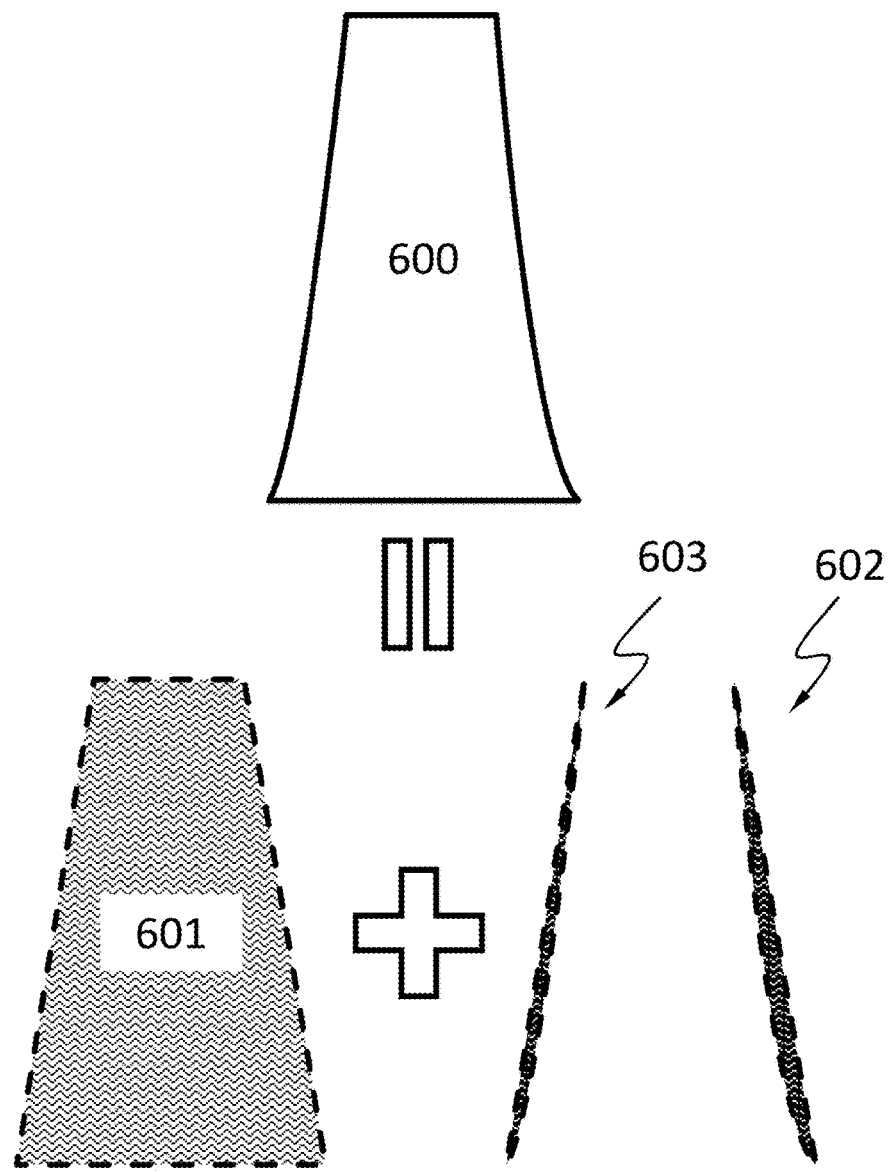

FIG. 6 schematically shows that, according to an embodiment, a shape 600 may be described by a sub-shape 601, which is a trapezoid, and two sub-shapes 602 and 603. In this example, the sub-shape 601 is of a higher order than the sub-shapes 602 and 603 because the sub-shape 601 captures the general geometry of the shape 600 and the sub-shapes 602 and 603 capture the details (e.g., the curved sides bending toward the interior of the shape 600). Notably, in this embodiment, the shape 600 may fit entirely inside the sub-shape 601 and so, the entire sub-shape 602 and the entire sub-shape 603 are thus "negative." Namely, when the sub-shapes 602, 603 and the sub-shape 601 are combined, the sub-shapes 602 and 603 are not added to, but subtracted from the sub-shape 601.

In an embodiment, shapes 300, 400, 500 and 600 may represent a "vertical" or "longitudinal" cross-section of a designed shape of a metrology target periodic structure feature (e.g., a cross-section of a metrology target grating line). In an embodiment, shapes 300, 400, 500 and 600 may represent a "vertical" or "longitudinal" cross-section of a designed shape of a device feature to be patterned on a substrate (e.g., a cross-section of an integrated circuit feature). In an embodiment, shapes 300, 400, 500 and 600 may represent a "vertical" or "longitudinal" cross-section of a designed shape of a patterning device feature used to produce a metrology target, a device feature, etc. (e.g., a cross-section of a feature of a mask). Of course, the shapes 300, 400, 500 and 600 may be different than those particular shapes depicted in FIGS. 3-6.

Figure 7:
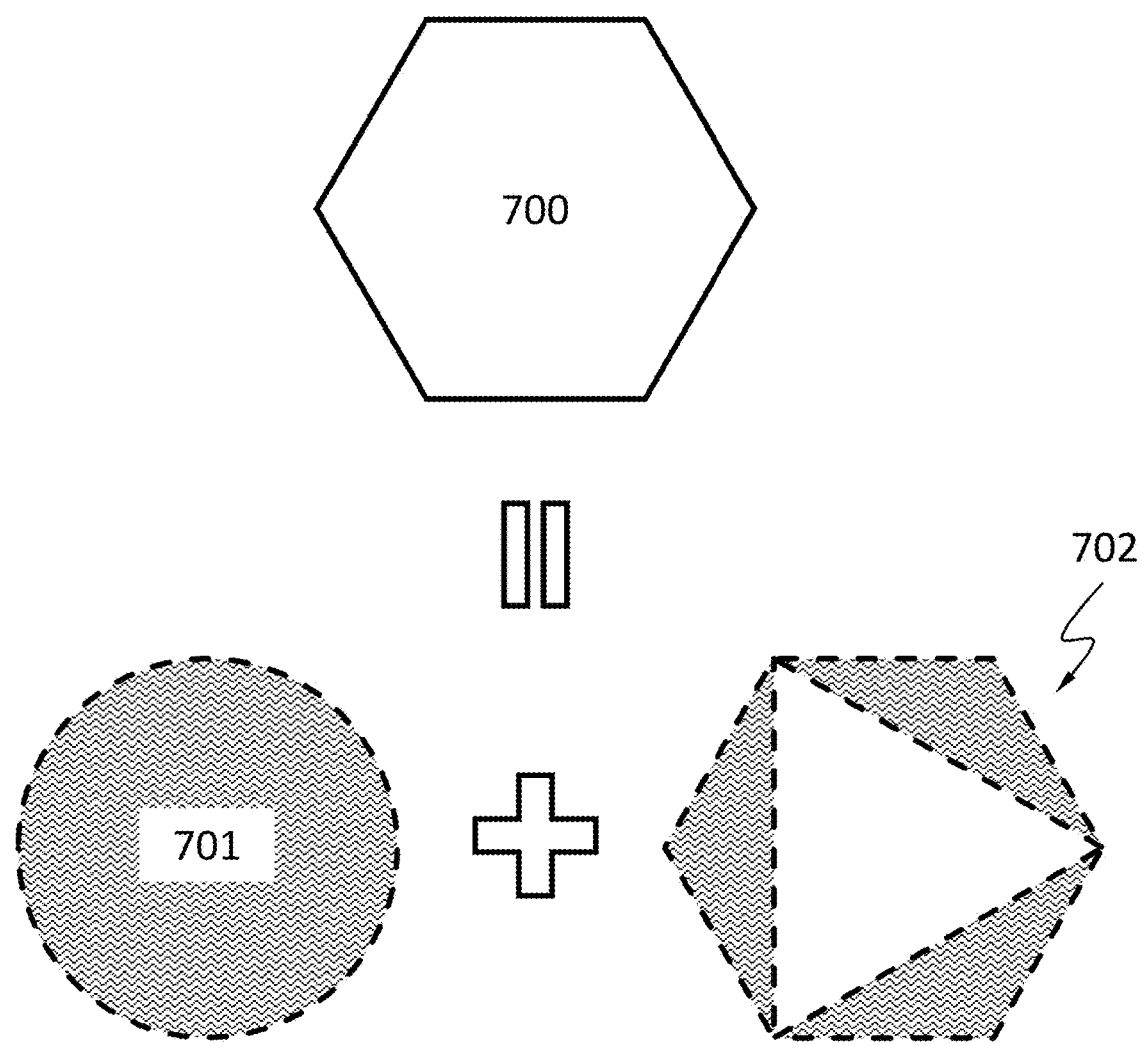

FIG. 7 schematically shows that, according to an embodiment, a shape 700 may be described by a sub-shape 701, which is a circle, and a sub-shape 702. In this example, the sub-shape 701 is of a higher order than the sub-shape 702 because the sub-shape 701 captures the general geometry of the shape 700 and the sub-shape 702 captures the details (e.g., the six corners). In this embodiment, the sub-shape 702 effectively comprises a plurality of triangles spatially arranged such that a vertex of each triangle abuts a vertex of another triangle as shown. The shape 700 is the union of the sub-shapes 701 and 702. The sub-shapes 701 and 703 have overlap with one another when combined. In an embodiment, shape 700 may represent a "horizontal" or "lateral" cross-section of a designed shape of a metrology target periodic structure feature (e.g., a cross-section of a metrology target grating line). In an embodiment, shape 700 may represent a "horizontal" or "lateral" cross-section of a designed shape of a device feature to be patterned on a substrate (e.g., a cross-section of an integrated circuit feature). In an embodiment, shape 700 may represent a "horizontal" or "lateral" cross-section of a designed shape of a patterning device feature used to produce a metrology target, a device feature, etc. (e.g., a cross-section of a feature of a mask). Of course, the shape 700 may be different than the particular shape depicted in FIG. 7.

Figure 8:
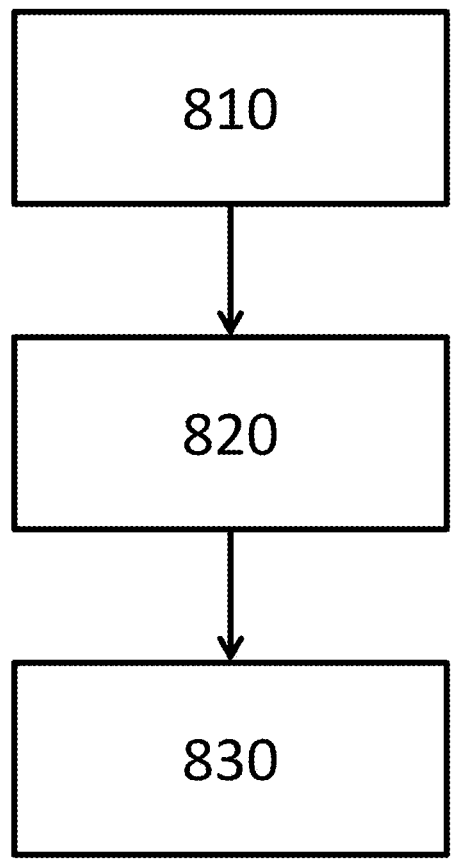
FIG. 8 shows a flow chart for a method of obtaining a hierarchical description of a shape.

FIG. 8 shows a flow chart for an embodiment of a method of obtaining a hierarchical description of a shape. In 810, one or more sub-shapes of the first order are fitted against the shape by or using, e.g., a computer system. The one or more sub-shapes of the first order may be obtained from a database (e.g., a library of geometric shapes), or empirically, or from a model. The sub-shapes of the first order (or any other order) may be obtained from the design layouts used to create the shape. For example, the one or more sub-shapes of the first order may be fitted so that the one or more shapes cover as much of the area or volume of the shape as possible while remaining entirely inside the shape. For example, the one or more sub-shapes of the first order may be fitted so that a function of the error between the one or more sub-shapes of the first order and the shape (e.g. the sum of the squares of the errors) are minimized. If more than one sub-shape of the first order is allowed, they may be allowed to overlap. In an embodiment, the fitting may be done by, for example, least squares fitting using, e.g., a library of shapes of the different orders, using a surface integral (perimeter/area) to find the sub-shapes of the different orders, etc. In 820, a fitting error is determined by or using, e.g., the computer system. The error comprises the one or more areas or volumes that are not part of the shape but are part of the one or more sub-shapes of the first order, and/or the one or more areas or volumes that are part of the shape but that are not parts of the one or more of the sub-shapes of the first order. In 830, one or more sub-shapes of the second order are fitted against the error by or using, e.g., the computer system. Like the fitting of the one or more sub-shapes of the first order, the one or more shapes of the second order may be obtained from a database, or empirically, or from a model. The sub-shapes of the second order (or any other order) may be obtained from the design layouts used to create the shape. For example, the one or more sub-shapes of the second order may be fitted so that it covers as much of the area or volume of the error as possible while remaining entirely inside the error. For example, the one or more sub-shapes of the second order may be fitted so that the sum of the squares of the errors between the one or more sub-shapes of the second order and the error is minimized. If more than one sub-shape of the second order is allowed, they may be allowed to overlap. One or more sub-shapes of the second order may be allowed to overlap with the one or more fitted sub-shapes of the first order. Sub-shapes of more than two orders may be fitted. The hierarchical description of the shape is compiled from the fitted sub-shapes of the at least two orders.

Figure 9:
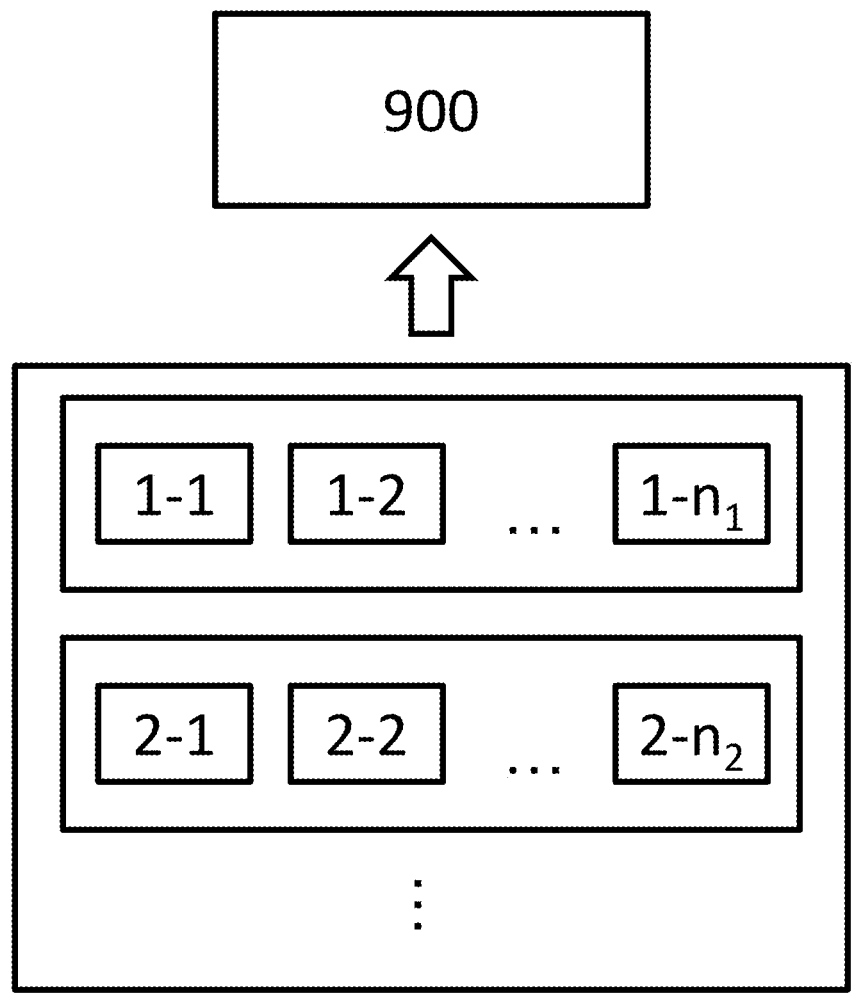
FIG. 9 schematically shows a data structure that represents a hierarchical description of a shape, according to an embodiment.

FIG. 9 schematically shows an embodiment of a data structure that represents a hierarchical description of a shape 900. The data structure may include descriptions of one or more sub-shapes of a first order 1-1, 1-2, . . . , 1-$n_1$ and one or more sub-shapes of a second order 2-1, 2-2, . . . , 2-$n_2$. The data structure may include descriptions of one of more sub-shapes of lower order than the second order. The descriptions of the sub-shapes may be values of parameters of the sub-shapes. For example, if one of the sub-shapes is a rectangle, the description of that one sub-shape may include its location, orientation, length of the shorter side, and aspect ratio. A sub-shape may be parameterized in a different or additional way. For example, the description of a rectangle may include its location, orientation, length of the shorter side, and length of the longer side. The data structure that represents the hierarchical description of the shape 900 may be stored on a non-transitory computer readable medium.

Figure 10:
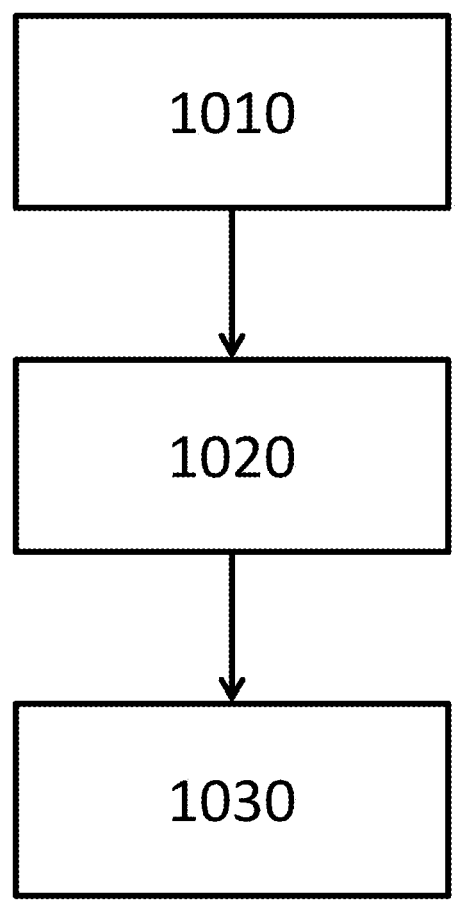
FIG. 10 shows a flow chart for a method of optimizing a hierarchical description of a shape, according to an embodiment.

FIG. 10 shows a flow chart for a method of optimizing a hierarchical description of a shape. In an optimization process of a system, a figure of merit of the system can be represented as a cost function. The optimization process may then boil down to a process of finding a set of parameters (design variables) of the system that minimizes/maximizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In 1010, one or more sub-shapes of the first order are fitted against the shape. In 1020, one or more sub-shapes of the second order are fitted against the shape. In 1030, the one or more sub-shapes of the first order and the one or more sub-shapes of the second order are co-optimized.

The determined one or more sub-shapes of the different orders may then be used in a model, such as described above in respect of FIGS. 2C and 2D. Then, using the techniques described, for example, in respect of FIGS. 2C and 2D, the model may be used with experimental data (e.g., a measured radiation distribution) to arrive at parameters and/or parameter values of the different order sub-shapes to arrive at a value of a parameter of interest (e.g., CD, overlay, dose, focus, etc.). That is, the different order sub-shapes are effectively fitted to the experimental data by determining the parameters and/or parameter values of the sub-shapes reflected by the experimental data. For example, the sub-shapes may be fitted to experimental data directly if, e.g., the experimental data is directly representative of geometric properties of the shape (e.g., image data). As a further example, the sub-shapes may be fitted to experimental data indirectly if, e.g., the experimental data is not directly representative of geometric properties of the shape (e.g., radiation distribution data from a diffractive target). In an embodiment, to do the fitting, each of the different order sub-shapes may be iterated against the experimental data with, e.g., the fitting of each following sub-shape of different order being against a residue from the fitting of an earlier sub-shape of different order against the experimental data.

Figure 11:
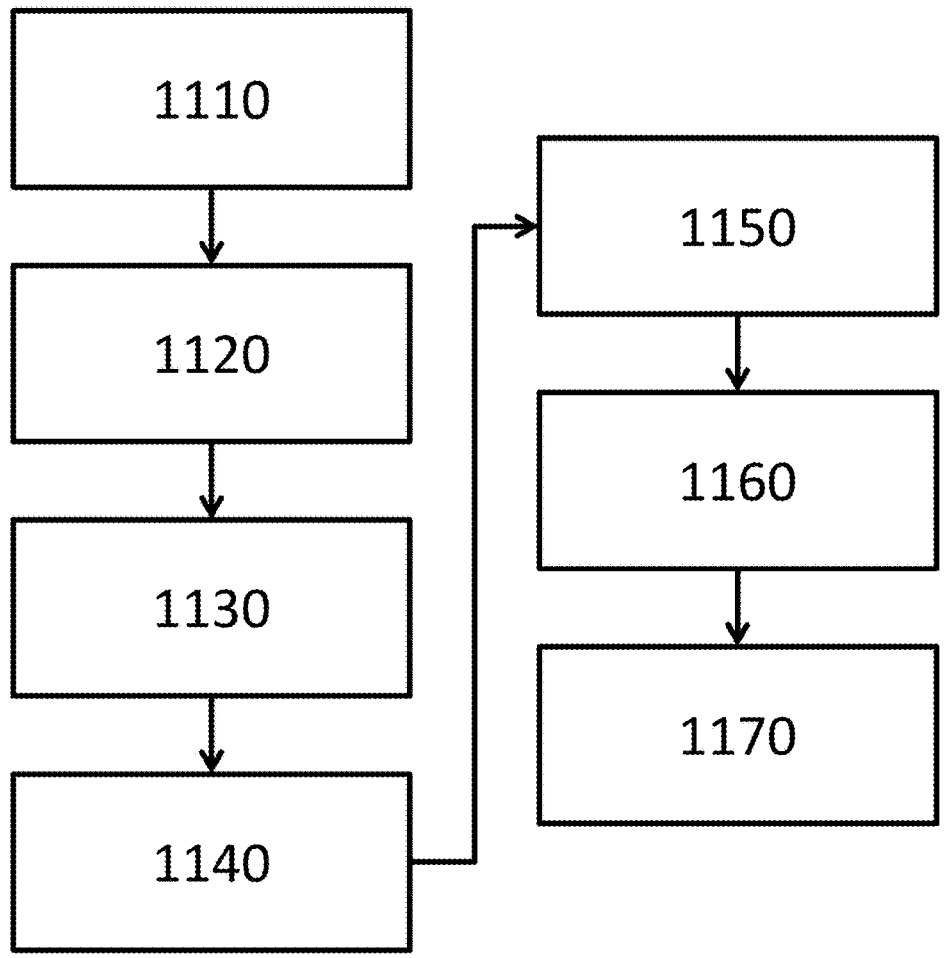
FIG. 11 and FIG. 12 each show a flow chart for a method of modeling experimental data (e.g., metrology data) obtained from a shape, according to an embodiment.

FIG. 11 shows a flow chart for a method of modeling experimental data (e.g., metrology data) obtained for a shape, according to an embodiment. In 1110, one or more sub-shapes of a first order are fitted against the experimental data. In other words, the one or more sub-shapes of the first order that would yield data best or well resembling the experimental data are determined. In 1120, the data that the fitted one or more sub-shapes of the first order alone would produce is determined (e.g., by simulation). In 1130, the residue data (i.e., the difference between the experimental data and the data the fitted one or more sub-shapes of the first order alone would produce) is determined. In 1140, one or more sub-shapes of the second order are fitted against the residue data. In 1150, the data that the fitted one or more sub-shapes of the second order alone would produce is determined (e.g., by simulation). In 1160, the determined data that the fitted one or more sub-shapes of the first order would produce and the determined data that the fitted one or more sub-shapes of the second order would produce are combined. In 1170, the fitted one or more sub-shapes of the first order and the fitted one or more sub-shapes may be adjusted (e.g., optimized) based on the combined data and the experimental data.

Figure 12:
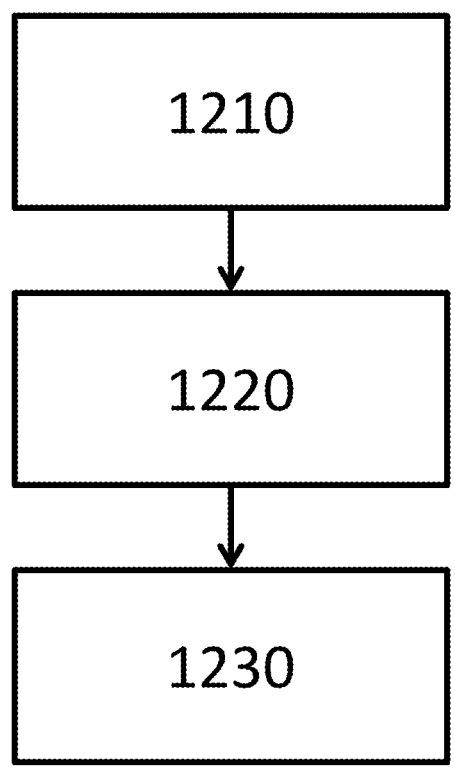

FIG. 12 shows a flow chart for a method of modeling experimental data (e.g., metrology data) obtained from a shape, according to an embodiment. In 1210, one or more sub-shapes of the first order and one or more sub-shapes of the second order are co-fitted against the experimental data. In other words, the one or more sub-shapes of the first order and one or more sub-shapes of the second order that would jointly produce data best or well resembling the experimental data are determined. In 1220, the data jointly produced by the co-fitted one or more sub-shapes of the first order and the co-fitted one or more sub-shapes of the second order are determined (e.g., by simulation). In 1230, the co-fitted one or more sub-shapes of the first order and the co-fitted one or more sub-shapes of the second order may be adjusted (e.g., optimized) based on the data they jointly would produce and the experimental data.

Figure 13:
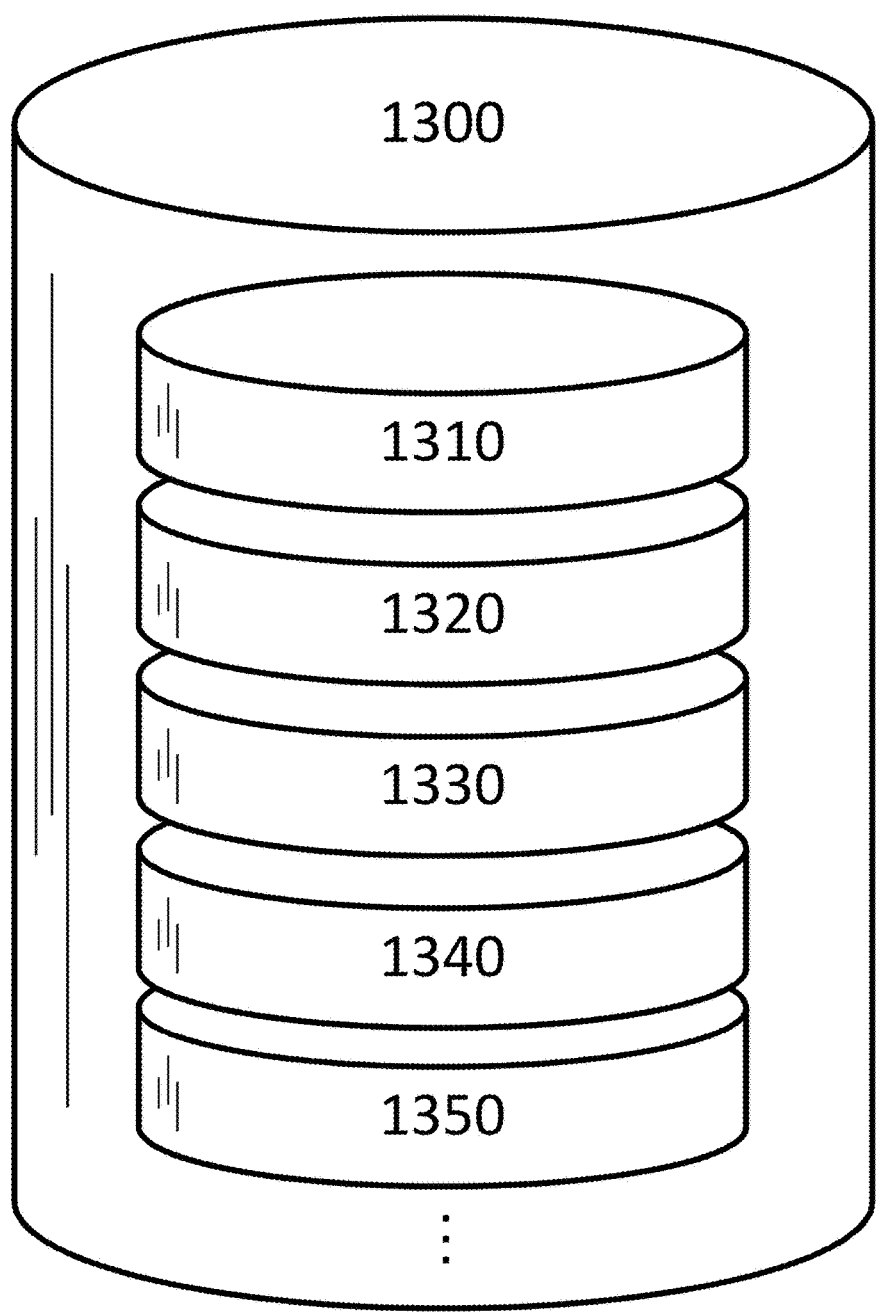
FIG. 13 schematically shows a database of sub-shapes.

FIG. 13 schematically shows a database 1300 of sub-shapes according to an embodiment. The database 1300 may be stored on a non-transitory computer readable medium. The database 1300 may be configured to store models of the sub-shapes and each of the models has one or more adjustable parameters. The sub-shapes whose models are stored in the database 1300 may have orders associated with them. In one example, a circle is a sub-shape of a first order 1310; a square is a sub-shape of a second order 1320; a rectangle is a sub-shape of a third order 1330; a triangle and a parallelogram are each a sub-shape of a fourth order 1340; a trapezoid is a sub-shape of a fifth order 1350, etc. In another example, a rectangle is a sub-shape of a first order 1310; a triangle and a parallelogram are each a sub-shape of a second order 1320; a trapezoid is a sub-shape of a third order 1330, etc. The order associated with a particular sub-shape may be determined empirically, by the number of parameters need to fully determine the sub-shape, or by any other suitable criterion. For example, the higher the order, the fewer parameters may be used to describe the sub-shape.

Figure 14:
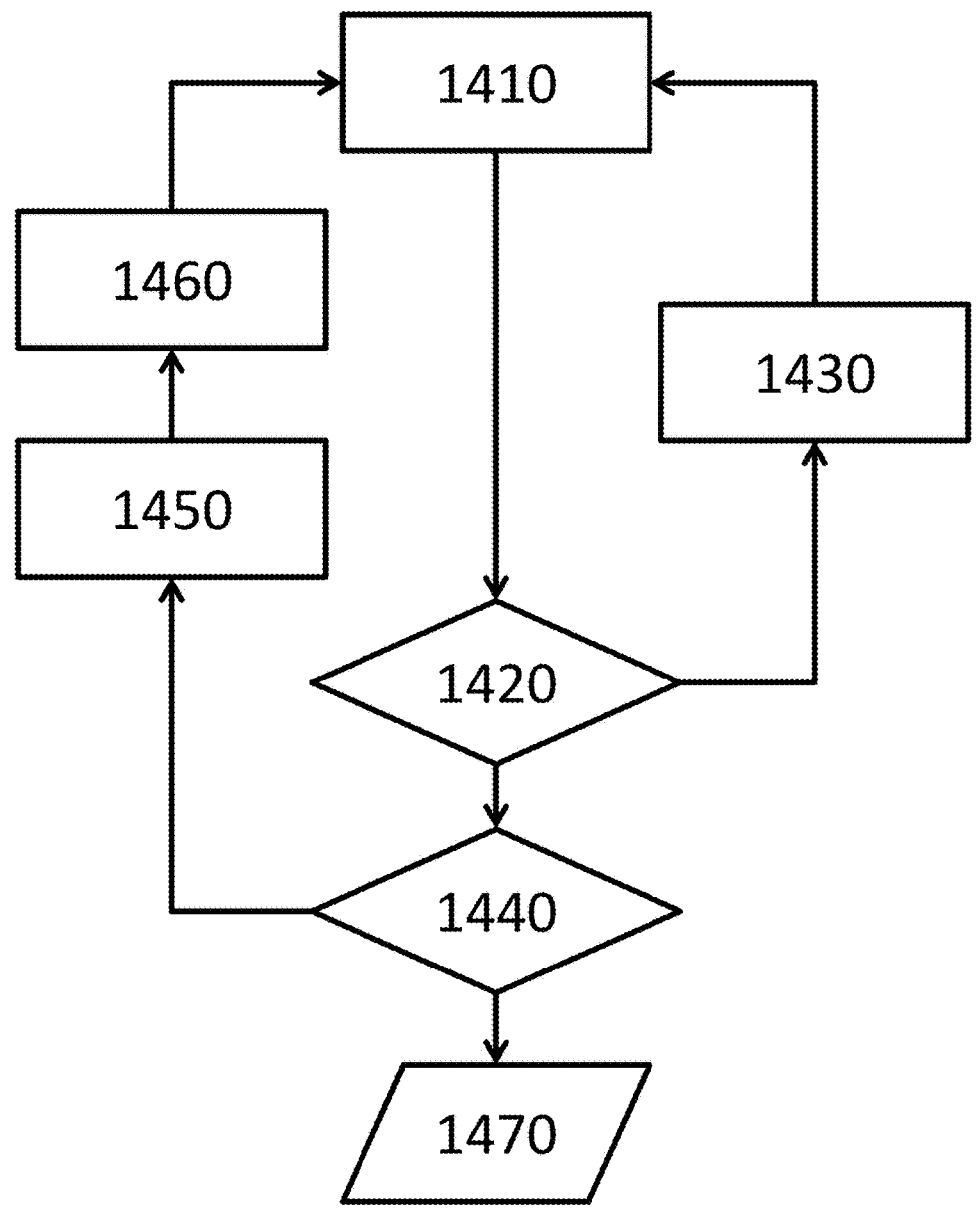
FIG. 14 shows a flow chart for a method of obtaining a hierarchical description of a shape, where more than one sub-shape of the same order may be used in the hierarchical description.

FIG. 14 shows a flow chart for an embodiment of a method of obtaining a hierarchical description of a shape, where more than one sub-shape of the same order may be used in the hierarchical description. In 1410, $n_k$ sub-shapes of the k-th order are co-fitted against the shape. $n_k$ may have an initial value of 1 or greater. The $n_k$ shapes of the k-th order may be obtained from a database (e.g., the database 1300), or empirically, or from a model. For example, the $n_k$ sub-shapes of the k-th order may be fitted so that these sub-shapes cover as much of the area or volume of the shape as possible while remaining entirely inside the shape. For example, the $n_k$ sub-shapes of the k-th order may be fitted so that the sum of the squares of the errors between the sub-shapes of the k-th order and the shape are minimized. The $n_k$ sub-shape of the k-th order may be allowed to overlap or may be restricted such that the sub-shapes do not overlap. In 1420, it is determined whether the fitted sub-shapes describe the shape sufficiently well under one or more criteria, or whether $n_k$ equals a maximum value $M_k$. If neither condition is true, the flow goes to 1430 where the value of $n_k$ is increased, for example, by one, and the flow goes back to 1410. If either condition is true, the flow goes to 1440, where it is determined whether sub-shapes of (k+1)-th order should be fitted against the shape, using one or more criteria. If fitting sub-shapes of (k+1)-th order is needed, the flow goes to 1450 where the value of k is increased by 1, and to 1460 where the value of $n_k$ is reset. If fitting sub-shapes of (k+1)-th order is not needed, the hierarchical description 1470 including the fitted sub-shapes of the first through the k-th orders is output.

In an embodiment, the shape 300, 400, 500, 600, or 700 may be a nominal design shape of the modeled structure. In an embodiment, the shape 300, 400, 500, 600, or 700 may be a measured shape of the modeled structure (e.g., an image processed shape from a CD-SEM image of the modeled structure).

Although overlay measurement can benefit from the hierarchical description of shapes as disclosed herein, the hierarchical description is not limited to overlay measurement.

The hierarchical description may be applicable in many applications that involve description of a shape.

Figure 15:
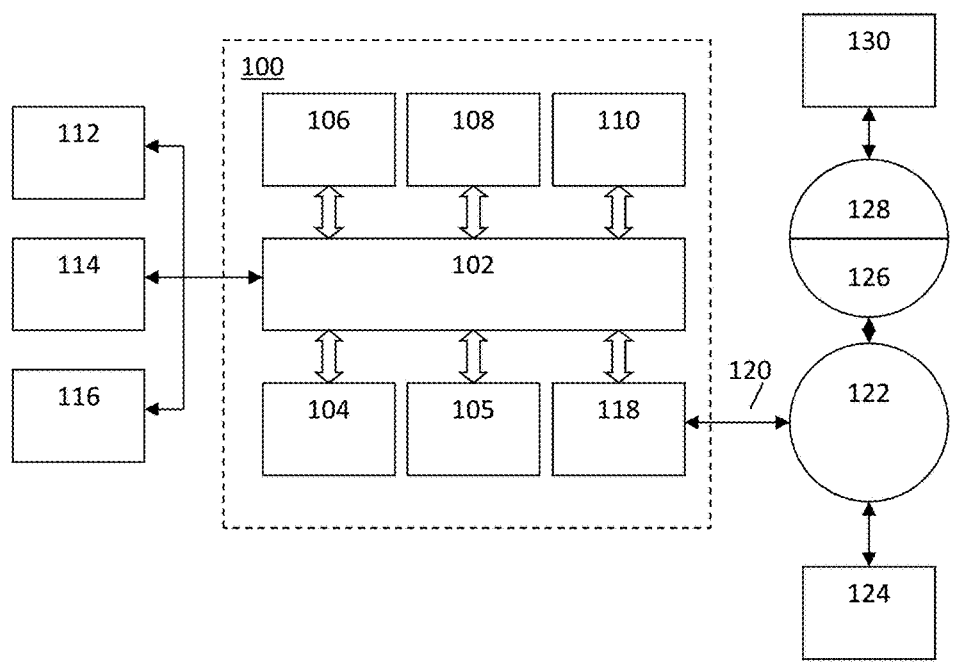
FIG. 15 is a block diagram of an example computer system.

FIG. 15 is an exemplary block diagram that illustrates a computer system 100 which can assist in embodying and/or implementing the methods disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
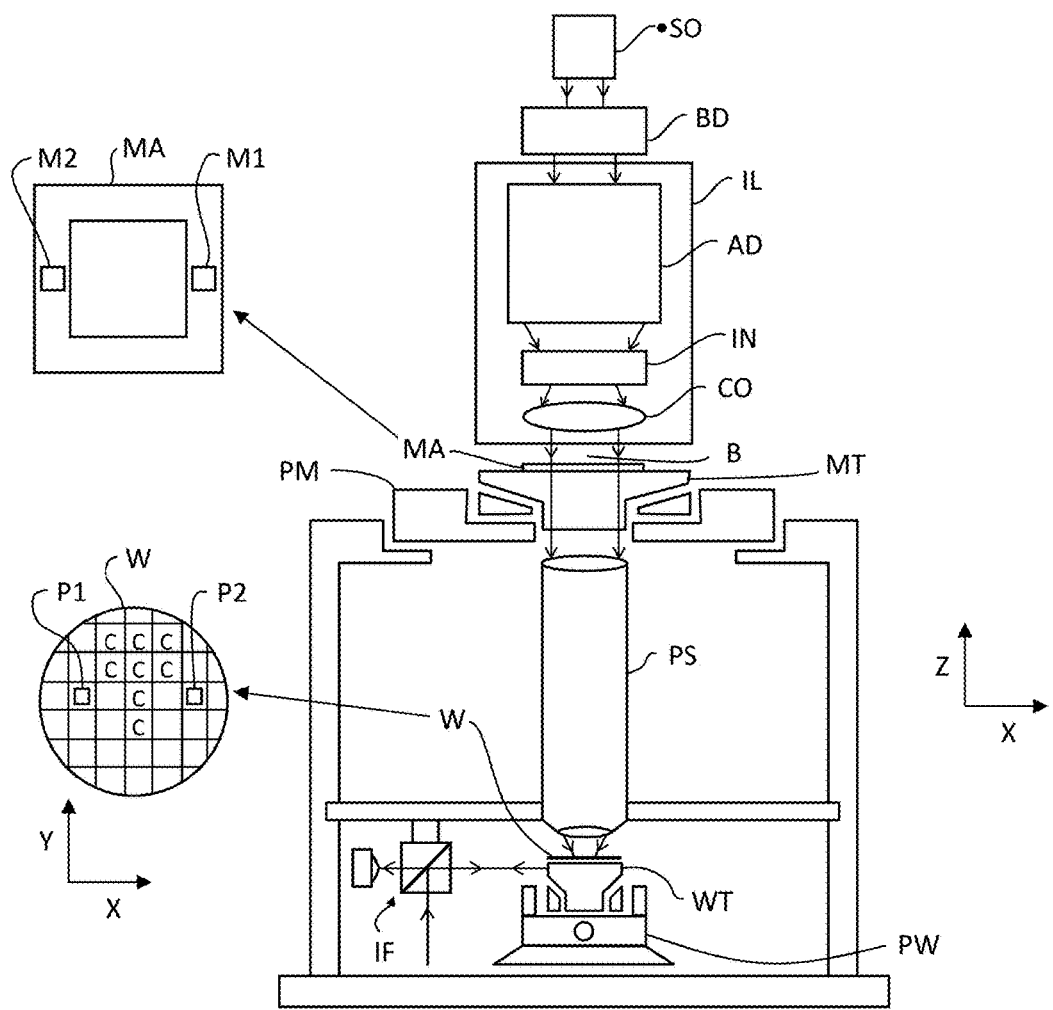
FIG. 16 a schematic diagram of a lithographic projection apparatus.

FIG. 16 schematically depicts an exemplary lithographic projection apparatus on which the methods disclosed herein could be used. The apparatus comprises:

a radiation system Ex, IL, for supplying a projection beam B of radiation. In this particular case, the radiation system also comprises a radiation source SO;

a first object table (e.g., mask table) MT configured to hold a patterning device MA (e.g., a reticle), and connected to a first positioner PM to accurately position the patterning device with respect to projection optics PS;

a second object table (substrate table) WT configured to hold a substrate W (e.g., a resist coated silicon wafer), and connected to a second positioner PW to accurately position the substrate with respect to projection optics PS;

a projection optics PS (e.g., a refractive, catoptric or catadioptric optical system) configured to image radiation from the patterning device MA onto a target portion C (e.g., comprising one or more dies) of the substrate W.

As depicted herein, the apparatus is of a transmissive type (e.g., has a transmissive mask). However, in general, it may also be of a reflective type (e.g., has a reflective mask).

The apparatus may employ another kind of patterning device as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam B subsequently intercepts the patterning device MA, which is held on a table MT. Having traversed the patterning device MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the patterning device MA with respect to the path of the beam B, e.g., after mechanical retrieval of a mask MA from a mask library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the table MT is kept essentially stationary, and an entire pattern image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the table MT is movable in a given direction (the so called "scan direction", e.g., the y direction) with a speed v, so that the projection beam PB is caused to scan over a pattern image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 17:
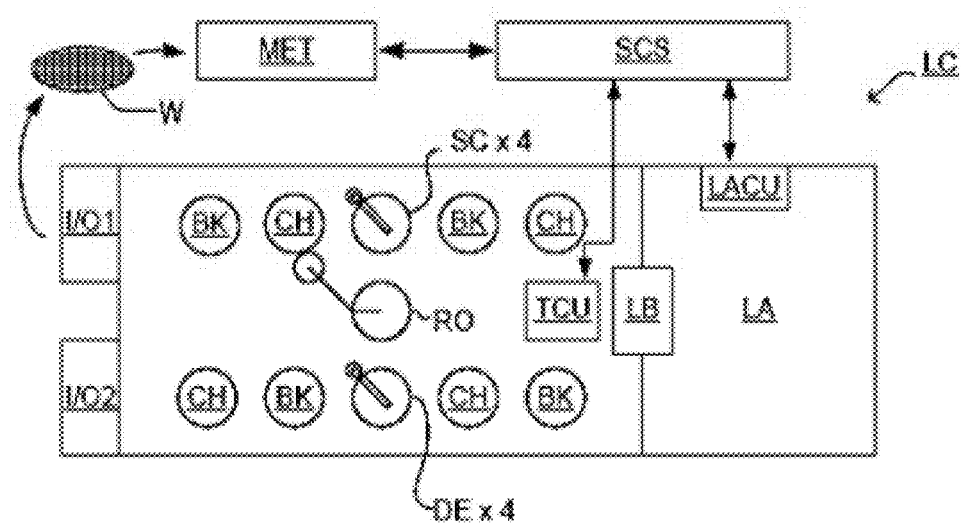
FIG. 17 schematically depicts a lithographic cell or cluster.

As shown in FIG. 17, the lithographic projection apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic projection apparatus. These apparatuses, which are often collectively referred to as the track, are under the control of a track control unit TCU which is itself controlled by the supervisory control system SCS, which also controls the lithographic projection apparatus via lithography control unit LACU. Thus, the different apparatuses can be operated to maximize throughput and processing efficiency.

In order that a substrate that is exposed by the lithographic projection apparatus is exposed correctly and consistently, it is desirable to inspect an exposed substrate to measure one or more properties such as overlay error between subsequent layers, line thickness, critical dimension (CD), etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic projection apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic projection apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 5-20 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

It should be readily apparent to those of ordinary skill in the art that changes and modifications in the form and details may be made without departing from the spirit and scope. It is intended that the appended claims encompass such changes and modification. The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a patterning apparatus or process such that results and/or processes of patterning have more one or more desirable characteristics, such as a higher accuracy of projection of a design layout on a substrate, a larger process window, etc.

Further, the lithographic projection apparatus may be of a type having two or more tables (e.g., two or more substrate tables, two or more patterning device tables, and/or a substrate table and a measurement table not designed to hold a substrate). In such "multiple stage" devices the additional tables may be used in parallel, or preparatory steps may be carried out on one or more tables while one or more other tables are being used for exposures.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

In this disclosure, the terms "mask", "reticle", "patterning device" are utilized interchangeably herein. Furthermore, masks and reticles can be broadly termed "patterning devices." Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device.

While discussion herein has focused on a lithographic or patterning process, the techniques described herein may be used in other manufacturing processes (e.g., etching, resist developing, etc. processes).

Detectors described herein may measure the intensity of radiation at a single wavelength (or narrow wavelength range), the intensity separately at multiple wavelengths or the intensity integrated over a wavelength range. Detectors described herein may separately measure the intensity of transverse magnetic- and transverse electric-polarized radiation and/or the phase difference between the transverse magnetic- and transverse electric-polarized radiation. Detectors described herein may detect polarized radiation passing via a polarizer and so provide polarization sensitive detection without, for example, necessarily measuring polarization.

The algorithms described in this document may be implemented via coding of a suitable software program to be performed by, e.g., processor system PU or its equivalent in the form of a dedicated microprocessor or the like.

Any controllers or control systems described herein may each or in combination be operable when the one or more computer programs are read by one or more computer processors located within at least one component of the lithographic apparatus or measurement apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers or control systems may include a data storage medium for storing such computer programs, and/or hardware to receive such medium. So the controller(s) or control system(s) may operate according the machine readable instructions of one or more computer programs.

Although specific reference may be made in this text to the use of embodiments in the context of metrology or inspection apparatus used to inspect or measure items in association with, e.g., optical lithography and/or manufacture of ICs, it will be appreciated that the methods and apparatus described herein may be used in other applications, for example imprint lithography, the use or manufacture of integrated optical systems, the use or manufacture of guidance and detection patterns for magnetic domain memories, the use or manufacture of flat-panel displays, the use or manufacture of liquid-crystal displays (LCDs), the use or manufacture of thin film magnetic heads, etc.

The substrate referred to herein may be processed, before or after exposure/patterning, in for example a track (a tool that typically applies a layer of resist to a substrate and develops the patterned/exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed or unprocessed layers.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of less than about 400 nm and greater than about 20 nm, or about 365, 355, 248, 193, 157 or 126 nm), extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and/or electrostatic optical components.

The descriptions above are intended to be illustrative, not limiting. Thus, it will be apparent to one skilled in the art that modifications may be made to the embodiments as described without departing from the scope of the claims set out below.

What is claimed is:

1. A method of metrology in a metrology apparatus for determining one or more parameters of interest of a structure, the method comprising:
    deriving a parameter of interest by:
        fitting at least one sub-shape of a first hierarchical order against a shape;
        determining an error function of the fitting;
        minimizing the error function between the at least one sub-shape of the first hierarchical order and the shape;
        fitting, after the minimizing step, at least one sub-shape of a second hierarchical order against the error function,
        wherein each of the at least one sub-shape of the first hierarchical order is parameterized as a first number of geometric parameters that define the physical shape of the sub-shape of the first hierarchical order,
        wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters; and storing the parameter of interest in a memory for use in a manufacturing process.

2. The method of claim 1, wherein the at least one sub-shape of the first hierarchical order is obtained from a database, a design layout, empirically, or from a model.

3. The method of claim 1, wherein fitting the at least one sub-shape of the first hierarchical order comprises determining a characteristic of the at least one sub-shape of the first hierarchical order that causes the at least one sub-shape of the first hierarchical order to cover as much of an area or a volume of the shape as possible while remaining entirely inside the shape.

4. The method of claim 1, comprising fitting a plurality of sub-shapes of the first hierarchical order against the shape, wherein the plurality of sub-shapes of the first hierarchical order at least partially overlap with one another.

5. The method of claim 1, wherein the shape is three dimensional.

6. The method of claim 1, comprising fitting a plurality of sub-shapes of the second hierarchical order against the shape, wherein the plurality of sub-shapes of the second hierarchical order at least partially overlap with at least one sub-shape of the first hierarchical order.

7. A method of metrology in a metrology apparatus for optimizing a hierarchical description of a shape, the method comprising:

fitting at least one sub-shape of a first hierarchical order against the shape;

fitting, after fitting the at least one sub-shape of the first hierarchical order, at least one sub-shape of a second hierarchical order against the shape;

co-optimizing the at least one sub-shape of the first hierarchical order and the at least one sub-shape of the second hierarchical order; and storing an optimized hierarchical description of the shape in a memory for use in a manufacturing process, wherein each of the at least one sub-shape of the first hierarchical order is parameterized as a first number of geometric parameters that define the physical shape of the sub-shape of the first hierarchical order, wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters.

8. The method of claim 7, wherein the at least one sub-shape of the first hierarchical order is obtained from a database, a design layout, empirically, or from a model.

9. The method of claim 7, wherein fitting the at least one sub-shape of the first hierarchical order comprises determining a characteristic of the at least one sub-shape of the first hierarchical order that causes the at least one sub-shape of the first hierarchical order to cover as much of an area or a volume of the shape as possible while remaining entirely inside the shape.

10. The method of claim 7, wherein fitting the at least one sub-shape of the first hierarchical order comprises minimizing an error function between the at least one sub-shape of the first hierarchical order and the shape.

11. The method of claim 7, comprising fitting a plurality of sub-shapes of the first hierarchical order against the shape, wherein the plurality of sub-shapes of the first hierarchical order at least partially overlap with one another.

12. The method of claim 7, wherein the shape is three dimensional.

13. The method of claim 7, comprising fitting a plurality of sub-shapes of the second hierarchical order against the shape, wherein the plurality of sub-shapes of the second hierarchical order at least partially overlap with at least one sub-shape of the first hierarchical order.

14. A method of metrology in a metrology apparatus for modeling experimental data obtained from a shape, the method comprising:

fitting at least one sub-shape of a first hierarchical order against the experimental data;

determining data that the fitted at least one sub-shape of the first hierarchical order alone would produce;

determining residue data, the residue data comprising a difference between the experimental data and the data the fitted at least one sub-shape of the first hierarchical order alone would produce;

fitting, after the determining residue data step, at least one sub-shape of a second hierarchical order against the residue data;

determining data that the fitted at least one sub-shape of the second hierarchical order alone would produce;

combining the data that the fitted at least one sub-shape of the first hierarchical order alone would produce and the data that the fitted at least one sub-shape of the second hierarchical order alone would produce;

optimizing the fitted at least one sub-shape of the first hierarchical order and the fitted at least one sub-shape of the second hierarchical order based on the combined data and the experimental data;

determining a hierarchical description of the shape based on the combined data and the experimental data; and storing the hierarchical description of the shape in a memory for use in a manufacturing process, wherein each of the at least one sub-shape of the first hierarchical order is parameterized as a first number of geometric parameters that define the physical shape of the sub-shape of the first hierarchical order, wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters.

15. The method of claim 14, wherein determining the data that the fitted at least one sub-shape of the first hierarchical order alone would produce comprises simulation.

16. The method of claim 14, wherein determining the data that the fitted at least one sub-shape of the second hierarchical order alone would produce comprises simulation.

17. The method of claim 14, wherein the shape is three dimensional.

18. A method of metrology in a metrology apparatus for modeling experimental data obtained from a shape, the method comprising:

fitting at least one first sub-shape of a first hierarchical order against the experimental data;

fitting, after fitting the at least one first sub-shape of the first hierarchical order, at least one second sub-shape of a second hierarchical order against the experimental data;

determining data that the fitted at least one sub-shape of the first hierarchical order and the fitted at least one sub-shape of the second hierarchical order jointly would produce;

optimizing the fitted at least one sub-shape of the first hierarchical order and the fitted at least one sub-shape of the second hierarchical order based on data produced from the first and second sub-shapes and the experimental data, determining a hierarchical description of the shape based on data produced from the first and second sub-shapes and the experimental data; and storing the hierarchical description of the shape in a memory for use in a manufacturing process, wherein each of the at least one first sub-shape of the first hierarchical order is parameterized as a first number of geometric parameters that define the physical shape of the first sub-shape of the first hierarchical order, wherein each of the at least one second sub-shape of the second hierarchical order is parameterized as a second number of geometric parameters that define the physical shape of the second sub-shape of the second hierarchical order, and wherein the first number of geometric parameters is less than the second number of geometric parameters.

19. The method of claim 18, wherein determining the data produced from the first and second sub-shapes comprises simulation.

20. The method of claim 18, wherein the shape is three dimensional.

21. A method of metrology in a metrology apparatus for obtaining a hierarchical description of a shape, the method comprising:

fitting a first plurality of sub-shapes of a first hierarchical order against the shape;

determining an error function of the fitting;

minimizing the error function between the first plurality of sub-shapes of the first hierarchical order and the shape;

fitting, after the minimizing step, a second plurality of sub-shapes of a second hierarchical order against the error function; and storing a hierarchical description of the shape in a memory for use in a manufacturing process, wherein each of the first plurality of sub-shapes of the first hierarchical order is parameterized as a first minimum number of geometric parameters that define the physical shape of the sub-shape of the first hierarchical order, wherein each of the second plurality of sub-shapes of the second hierarchical order is parameterized as a second minimum number of geometric parameters that define the physical shape of the sub-shape of the second hierarchical order, and wherein the first minimum number of geometric parameters is less than the second minimum number of geometric parameters.

22. The method of claim 21, wherein the shape is three dimensional.

23. The method of claim 21, wherein the first and second minimum number of geometric parameters comprises at least one of the group consisting of location, orientation, radius, length of a side, and aspect ratio.

24. A method of metrology in a metrology apparatus for determining one or more parameters of interest of a target of a device pattern on a series of substrates using a patterning process, the method comprising:

inspecting the target associated with the device pattern, and formed on at least one of the substrates;

deriving a parameter of interest by:

fitting at least one sub-shape of a first hierarchical order against a shape;

determining an error function of the fitting;

minimizing the error function between the at least one sub-shape of the first hierarchical order and the shape;

fitting, after the minimizing step, at least one sub-shape of a second hierarchical order against the error function, wherein each of the at least one sub-shape of the first hierarchical order is parameterized as a first number of geometric parameters that define the physical shape of the sub-shape of the first hierarchical order, wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters; and storing the parameter of interest in a memory for use in a manufacturing process.

25. A computer program product comprising a non-transitory computer readable medium having instructions recorded thereon, the instructions when executed by a computer implement a method comprising:

fitting a at least one sub-shape of a first hierarchical order against a shape;

determining an error function of the fitting;

minimizing the error function between the at least one sub-shape of the first hierarchical order and the shape; and fitting, after the minimizing step, at least one sub-shape of a second hierarchical order against the error function, wherein each of the at least one sub-shape of the first hierarchical order is parameterized as a first number of geometric parameters that define the physical shape of the sub-shape of the first hierarchical order, wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters.

26. A system comprising:

an inspection apparatus configured to provide a beam on a measurement target on a substrate and to detect radiation redirected by the target to determine a parameter of a patterning process; and a non-transitory computer program product configured to evaluate performance of the inspection apparatus in accordance with the parameter of the patterning process, the non-transitory computer program product comprising instructions recorded thereon, the instructions when executed, implement a method comprising:

fitting at least one sub-shape of a first hierarchical order against a shape of the target;

determining an error function of the fitting;

minimizing the error function between the at least one sub-shape of the first hierarchical order and the shape; and fitting, after the minimizing step, at least one sub-shape of a second hierarchical order against the error function, wherein each of the at least one sub-shape of the first hierarchical order is parameterized as a first number of geometric parameters that define the physical shape of the sub-shape of the first hierarchical order, wherein each of the at least one sub-shape of the second hierarchical order is parameterized as a second number of geometric parameters that define the physical shape of the sub-shape of the second hierarchical order, and wherein the first number of geometric parameters is less than the second number of geometric parameters.

27. The system of claim 26, further comprising a lithographic apparatus, the lithographic apparatus comprising:

a support structure configured to hold a patterning device to modulate a radiation beam; and a projection optical system arranged to project the modulated radiation beam onto a radiation-sensitive substrate.

* * * * *

UNITED STATES PATENT AND TRADEMARK OFFICE
CERTIFICATE OF CORRECTION

PATENT NO. : 10,379,446 B2  
APPLICATION NO. : 15/270150  
DATED : August 13, 2019  
INVENTOR(S) : Verma et al.

Page 1 of 1

It is certified that error appears in the above-identified patent and that said Letters Patent is hereby corrected as shown below:

In the Claims

In Column 28, Claim 25, Line 26, please delete "a at least" and insert --at least--.

Signed and Sealed this
Tenth Day of December, 2019

Andrei Iancu
*Director of the United States Patent and Trademark Office*